US011297228B2

(12) United States Patent
Ono

(10) Patent No.: US 11,297,228 B2
(45) Date of Patent: Apr. 5, 2022

(54) IMAGE PROCESSING APPARATUS, IMAGING APPARATUS, IMAGE PROCESSING METHOD, AND PROGRAM

(71) Applicant: FUJIFILM Corporation, Tokyo (JP)

(72) Inventor: Shuji Ono, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 52 days.

(21) Appl. No.: 16/601,594

(22) Filed: Oct. 15, 2019

(65) Prior Publication Data

US 2020/0043203 A1 Feb. 6, 2020

Related U.S. Application Data

(63) Continuation of application No. PCT/JP2018/014349, filed on Apr. 4, 2018.

(30) Foreign Application Priority Data

Apr. 25, 2017 (JP) .............................. JP2017-086452

(51) Int. Cl.
*H04N 5/232* (2006.01)
*G06T 5/50* (2006.01)

(52) U.S. Cl.
CPC ........... *H04N 5/23229* (2013.01); *G06T 5/50* (2013.01); *G06T 2207/20212* (2013.01); *G06T 2207/30181* (2013.01)

(58) Field of Classification Search
CPC .. H04N 5/23229; H04N 5/2251; H04N 5/232; H04N 5/23245; H04N 5/23296;
(Continued)

(56) References Cited

U.S. PATENT DOCUMENTS 5,805,106 A * 9/1998 Baum ....................... G06T 5/50
342/159
6,028,303 A 2/2000 Suzuki
(Continued)

FOREIGN PATENT DOCUMENTS

CN 102301694 12/2011
CN 105872393 8/2016
(Continued)

OTHER PUBLICATIONS

"International Search Report (Form PCT/ISA/210) of PCT/JP2018/014349", dated Jun. 5, 2018, with English translation thereof, pp. 1-3.
(Continued)

*Primary Examiner* — Siamak Harandi
(74) *Attorney, Agent, or Firm* — JCIPRNET

(57) ABSTRACT

An image processing apparatus 500 includes an image obtaining unit 501 that obtains a plurality of frame images of the same scene including a water surface having a wave, a brightness value calculation unit 503 that calculates a brightness value corresponding to a minute region constituting each frame image based on the plurality of frame images, a pixel value extraction unit 505 that extracts a pixel value corresponding to the minute region of a frame image in which the brightness value of the minute region is a brightness value lower than the brightness value of the minute region of another frame image in the plurality of frame images, a storage unit 507 that stores the pixel value extracted by the pixel value extraction unit 505, and a composite image generation unit 509 that generates a composite image corresponding to the scene based on the pixel value stored in the storage unit 507.

7 Claims, 30 Drawing Sheets

(58) Field of Classification Search
CPC ...... H04N 5/2351; H04N 5/2355; G06T 5/50; G06T 2207/20212; G06T 2207/30181; G06T 2207/20221; G06T 7/90; G06T 11/001; G06T 13/60; G06T 2207/30168; G01N 21/27; G03B 11/04; G03B 15/00; H01L 27/14609; H01L 27/14625
See application file for complete search history.

(56) References Cited

U.S. PATENT DOCUMENTS

| | | | | |
|---|---|---|---|---|
| 2005/0018882 | A1* | 1/2005 | Muste | G01F 23/292 382/107 |
| 2009/0303055 | A1* | 12/2009 | Anderson | G08B 21/086 340/573.6 |
| 2010/0008595 | A1* | 1/2010 | Riley | G06K 9/4661 382/254 |
| 2011/0305388 | A1 | 12/2011 | Wedi et al. | |
| 2015/0172529 | A1 | 6/2015 | Aota | |
| 2015/0381871 | A1* | 12/2015 | Makino | H04N 5/243 348/335 |
| 2019/0096085 | A1* | 3/2019 | Ueda | G06T 7/12 |
| 2019/0273856 | A1* | 9/2019 | Hirasawa | H04N 5/225 |

FOREIGN PATENT DOCUMENTS

| | | |
|---|---|---|
| EP | 3200446 | 8/2017 |
| EP | 3544283 | 9/2019 |
| JP | H0830765 | 2/1996 |
| JP | H10145668 | 5/1998 |
| JP | 2006284525 | 10/2006 |
| JP | 2007086720 | 4/2007 |
| JP | 2014074838 | 4/2014 |

OTHER PUBLICATIONS

"Written Opinion of the International Searching Authority (Form PCT/ISA/237) of PCT/JP2018/014349", dated Jun. 5, 2018, with English translation thereof, pp. 1-7.

"Search Report of Europe Counterpart Application", dated Aug. 12, 2020, pp. 1-13.

"Office Action of Europe Counterpart Application", dated Dec. 7, 2020, p. 1-p. 22.

"Office Action of China Counterpart Application" with English translation thereof, dated Aug. 31, 2021, p. 1-p. 14.

"Office Action of China Counterpart Application" with English translation thereof, dated Dec. 23, 2021, p. 1-p. 14.

* cited by examiner

IMAGE PROCESSING APPARATUS, IMAGING APPARATUS, IMAGE PROCESSING METHOD, AND PROGRAM

CROSS-REFERENCE TO RELATED APPLICATIONS

This application is a Continuation of PCT International Application No. PCT/JP2018/014349 filed on Apr. 4, 2018, which claims priority under 35 U.S.C § 119(a) to Japanese Patent Application No. 2017-086452 filed on Apr. 25, 2017. Each of the above application(s) is hereby expressly incorporated by reference, in its entirety, into the present application.

BACKGROUND OF THE INVENTION

1. Field of the Invention

The present invention relates to an image processing apparatus, an imaging apparatus, an image processing method, and a program and particularly, to a technology for obtaining an image in which an effect of reflected light from a water surface is reduced.

2. Description of the Related Art

In the case of observing and imaging a target object in water from land (in the air), the subject in water may not be able to be appropriately imaged due to the effect of reflected light on the water surface. The reason is that light from the subject in water is buried in the reflected light on the water surface, and the light from the subject in water cannot be sufficiently captured.

In the related art, a technology for reducing the effect of the reflected light on the water surface using a polarization filter that uses the properties of the Brewster angle is suggested.

For example, in JP1998-145668A (JP-H10-145668A), a technology related to a camera comprising a polarization filter is disclosed. The camera comprising the polarization filter in the disclosure of JP1998-145668A (JP-H10-145668A) comprises the polarization filter that can be rotated. The polarization filter is rotated by a drive control unit such that a signal corresponding to the level of a video signal of the subject is minimized.

SUMMARY OF THE INVENTION

However, the polarization filter can effectively exclude the reflected light in only the vicinity of the Brewster angle. That is, in the technology for reducing the effect of the reflected light using only the polarization filter, the effect of the reflected light of light that is incident at an incidence angle larger than the Brewster angle cannot be effectively reduced. Accordingly, in a case where an angle formed between an optical axis (line of sight of the camera) and a water surface normal line is large, the polarization filter does not effectively work, and the effect of the reflected light on the water surface is not reduced.

Even in a case where the water surface is imaged by the camera comprising the polarization filter in the disclosure of JP1998-145668A (JP-H10-145668A), a case where the effect of the reflected light cannot be sufficiently reduced occurs in a location in which the angle formed between the optical axis and the water surface normal line is large.

The present invention is conceived in view of such matters. An object of the present invention is to provide an image processing apparatus, an imaging apparatus, an image processing method, and a program capable of generating an image in which an effect of reflected light on a water surface is reduced in a wide range.

In order to achieve the object, an image processing apparatus that is one aspect of the present invention comprises an image obtaining unit that obtains a plurality of frame images of the same scene including a water surface having a wave, a brightness value calculation unit that calculates a brightness value corresponding to a minute region constituting each frame image based on the plurality of frame images, a pixel value extraction unit that extracts a pixel value corresponding to the minute region of a frame image in which the brightness value of the minute region is a brightness value lower than the brightness value of the minute region of another frame image in the plurality of frame images, a storage unit that stores the pixel value extracted by the pixel value extraction unit, and a composite image generation unit that generates a composite image corresponding to the scene based on the pixel value stored in the storage unit.

According to the present aspect, the pixel value corresponding to the minute region of the frame image in which the brightness value of the minute region is lower than the brightness value of the minute region of the other frame image in the plurality of frame images is extracted by the pixel value extraction unit. The extracted pixel value is stored in the storage unit. The composite image is generated by the composite image generation unit based on the pixel value stored in the storage unit. That is, according to the present aspect, the composite image generated by the composite image generation unit is configured with the pixel value in a case where the brightness value is the minimum.

Accordingly, in the present aspect, an image in which the effect of reflected light is reduced in a wide range of the imaged water surface is generated. That is, in the composite image generated in the present aspect, the effect of reflected light on the water surface is reduced in a wide range, and the water surface or the inside of water is clearly captured.

An image processing apparatus that is another aspect of the present invention comprises an image obtaining unit that obtains an image corresponding to a plurality of frames of the same scene in which a water quality examination target including a water surface having a wave is captured, each frame including a first image and a second image, the first image being an image based on a first wavelength range, and the second image being an image based on a second wavelength range different from the first wavelength range, a pixel value calculation unit that calculates a sum of a pixel value of the first image and a pixel value of the second image for each minute region in each frame based on the first image and the second image in the plurality of frames, a proportion or difference calculation unit that calculates a proportion or a difference between the pixel value of the first image and the pixel value of the second image corresponding to the minute region in a case where the sum of the pixel value of the first image and the pixel value of the second image in the minute region is the minimum in the plurality of frames, a storage unit that stores the proportion or the difference calculated by the proportion or difference calculation unit, a water quality data calculation unit that calculates water quality data of the water quality examination target based on the proportion or the difference stored in the storage unit, and a water quality distribution image generation unit that generates a water quality distribution image showing a water quality distribution of the water quality examination target based on the water quality data calculated by the water quality data calculation unit.

According to the present aspect, the proportion or the difference between the pixel value of the first image and the pixel value of the second image corresponding to the minute region in a case where the sum of the pixel value of the first image and the pixel value of the second image in the minute region is the minimum in the plurality of frames is calculated by the proportion or difference calculation unit. The calculated proportion or difference is stored in the storage unit. According to the present aspect, the water quality data of the water quality examination target is calculated by the water quality data calculation unit based on the proportion or the difference stored in the storage unit. The water quality distribution image showing the water quality distribution of the water quality examination target is generated by the water quality distribution image generation unit based on the calculated water quality data.

Accordingly, in the present aspect, an image in which the effect of reflected light is reduced in a wide range of the imaged water surface is generated. That is, in the water quality distribution image generated in the present aspect, the effect of reflected light on the water surface is reduced, and an accurate water quality distribution is shown.

An image processing apparatus that is still another aspect of the present invention comprises an image obtaining unit that obtains an image corresponding to a plurality of frames of the same scene in which a water quality examination target including a water surface having a wave is captured, each frame including a first image, a second image, and a third image, the first image being an image based on a first wavelength range, the second image being an image based on a second wavelength range different from the first wavelength range, and the third image being an image based on a third wavelength range which includes the first wavelength range and the second wavelength range, a pixel value obtaining unit that obtains a pixel value corresponding to a minute region constituting each third image based on the third images of the plurality of frames, a proportion or difference calculation unit that calculates a proportion or a difference between the pixel value of the first image and the pixel value of the second image corresponding to the minute region in a case where the pixel value of the minute region is the minimum in the plurality of frames, a storage unit that stores the proportion or the difference calculated by the proportion or difference calculation unit, a water quality data calculation unit that calculates water quality data of the water quality examination target based on the proportion or the difference stored in the storage unit, and a water quality distribution image generation unit that generates a water quality distribution image showing a water quality distribution of the water quality examination target based on the water quality data calculated by the water quality data calculation unit.

According to the present aspect, the proportion or the difference between the pixel value of the first image and the pixel value of the second image corresponding to the minute region in a case where the pixel value of the minute region of each third image is the minimum in the plurality of frames is calculated by the proportion or difference calculation unit. The proportion or the difference calculated by the proportion or difference calculation unit is stored in the storage unit. According to the present aspect, the water quality data of the water quality examination target is calculated by the water quality data calculation unit based on the proportion or the difference stored in the storage unit. The water quality distribution image showing the water quality distribution of the water quality examination target is generated by the water quality distribution image generation unit based on the water quality data calculated by the water quality data calculation unit.

Accordingly, in the present aspect, an image in which the effect of reflected light is reduced in a wide range of the imaged water surface is generated. That is, in the water quality distribution image generated in the present aspect, the effect of reflected light on the water surface is reduced, and an accurate water quality distribution is shown.

It is preferable that the first wavelength range is a wavelength range including 670 nm, and the second wavelength range is a wavelength range including 700 nm, the water quality data calculation unit calculates a concentration of chlorophyll a as the water quality data of the water quality examination target based on the first image and the second image obtained by the image obtaining unit, and the water quality distribution image generation unit generates a concentration distribution image showing a distribution of the calculated concentration of chlorophyll a as the water quality distribution image.

According to the present aspect, the first wavelength range is a wavelength range including 670 nm, and the second wavelength range is a wavelength range including 700 nm. The concentration of chlorophyll a is calculated as the water quality data of the water quality examination target by the water quality data calculation unit based on the first image and the second image obtained by the image obtaining unit. The concentration distribution image showing the distribution of the calculated concentration of chlorophyll a is generated as the water quality distribution image by the water quality distribution image generation unit.

Accordingly, in the water quality distribution image generated in the present aspect, the effect of reflected light on the water surface is reduced, and an accurate distribution of the concentration of chlorophyll a is shown.

It is preferable that the third wavelength range is a wavelength range of visible light.

According to the present aspect, the third wavelength range is the wavelength range of visible light. Thus, the effect of reflected light on the water surface can be more appropriately detected, and the water quality distribution image in which the effect of reflected light is further reduced can be obtained.

It is preferable that the minute region is a region of one pixel.

According to the present aspect, the minute region is the region of one pixel. Accordingly, in the present aspect, the effect of reflected light is reduced in a smaller region.

It is preferable that the wave is an artificially generated wave.

According to the present aspect, the wave is the artificially generated wave. Accordingly, in the present aspect, even for the water surface on which a natural wave is not generated, the effect of reflected light on the water surface can be reduced by artificially generating the wave and obtaining the composite image or the water quality distribution image.

An imaging apparatus that is still another aspect of the present invention comprises the image processing apparatus.

It is preferable that the same scene including the water surface having the wave is imaged by fixing the imaging apparatus at a fixed point.

According to the present aspect, the same scene including the water surface having the wave is imaged by fixing the imaging apparatus at the fixed point. Thus, an image of the same scene is accurately captured, and an image in which blurriness of an imaging target is reduced is generated.

It is preferable that the imaging apparatus further comprises a polarization filter through which a luminous flux of the same scene including the water surface having the wave passes.

According to the present aspect, the imaging apparatus further comprises the polarization filter through which the luminous flux of the same scene including the water surface having the wave passes. Accordingly, in the present aspect, the effect of polarized light that is reflected by the water surface can be effectively reduced. Thus, an image in which the effect of reflected light is further reduced can be obtained.

An imaging apparatus that is still another aspect of the present invention comprises the image processing apparatus, an imaging optical system including an image forming lens, and a first optical filter and a second optical filter that respectively correspond to a first region and a second region of the image forming lens, the first optical filter allowing transmission of light having the first wavelength range, and the second optical filter allowing transmission of light having the second wavelength range, and a directional sensor that includes a plurality of pixels configured with two-dimensionally arranged photoelectric conversion elements and selectively receives each of luminous fluxes incident through the first optical filter and the second optical filter of the imaging optical system by pupil separation.

According to the present aspect, the first image and the second image having different wavelength ranges are captured using the imaging optical system including the image forming lens, and the first optical filter and the second optical filter that respectively correspond to the first region and the second region of the image forming lens. The first optical filter allows transmission of light having the first wavelength range, and the second optical filter allows transmission of light having the second wavelength range. Accordingly, the present aspect can achieve a decrease in size and weight of the imaging apparatus.

In addition, according to the present aspect, the first image and the second image are captured by one imaging optical system. Thus, the first image and the second image can be appropriately captured by adjusting one imaging optical system.

In addition, according to the present aspect, the first image and the second image are captured by the directional sensor that selectively receives each of the luminous fluxes incident through the first optical filter and the second optical filter of the imaging optical system by pupil separation, and one imaging optical system. Accordingly, in the present aspect, registration between the first image and the second image is not necessary.

In addition, according to the present aspect, the first image and the second image can be independently obtained as separated image data at the same time.

An imaging apparatus that is still another aspect of the present invention comprises the image processing apparatus, an imaging optical system including an image forming lens, and a first optical filter, a second optical filter, and a third optical filter that respectively correspond to a first region, a second region, and a third region of the image forming lens, the first optical filter allowing transmission of light having the first wavelength range, the second optical filter allowing transmission of light having the second wavelength range, and the third optical filter allowing transmission of light having the third wavelength range, and a directional sensor that includes a plurality of pixels configured with two-dimensionally arranged photoelectric conversion elements and selectively receives each of luminous fluxes incident through the first optical filter, the second optical filter, and the third optical filter of the imaging optical system by pupil separation.

According to the present aspect, the first image, the second image, and the third image are captured using the imaging optical system including the image forming lens, and the first optical filter, the second optical filter, and the third optical filter that respectively correspond to the first region, the second region, and the third region of the image forming lens. The first optical filter allows transmission of light having the first wavelength range. The second optical filter allows transmission of light having the second wavelength range. The third optical filter allows transmission of light having the third wavelength range. Accordingly, the present aspect can achieve a decrease in size and weight of the imaging apparatus.

In addition, according to the present aspect, the first image, the second image, and the third image are captured by one imaging optical system. Thus, the first image, the second image, and the third image can be appropriately captured by adjusting one imaging optical system.

In addition, according to the present aspect, the first image, the second image, and the third image are captured by the directional sensor that selectively receives each of the luminous fluxes incident through the first optical filter, the second optical filter, and the third optical filter of the imaging optical system by pupil separation, and one imaging optical system. Accordingly, in the present aspect, registration among the first image, the second image, and the third image is not necessary.

According to the present aspect, the first image, the second image, and the third image can be independently obtained as separated image data at the same time.

An image processing method that is still another aspect of the present invention comprises an image obtaining step of obtaining a plurality of frame images of the same scene including a water surface having a wave, a brightness value calculation step of calculating a brightness value corresponding to a minute region constituting each frame image based on the plurality of frame images, a pixel value extraction step of extracting a pixel value corresponding to the minute region of a frame image in which the brightness value of the minute region is a brightness value lower than the brightness value of the minute region of another frame image in the plurality of frame images, a storage step of storing the pixel value extracted in the pixel value extraction step, and a composite image generation step of generating a composite image corresponding to the scene based on the pixel value stored in the storage step.

An image processing method that is still another aspect of the present invention comprises an image obtaining step of obtaining an image corresponding to a plurality of frames of the same scene in which a water quality examination target including a water surface having a wave is captured, each frame including a first image and a second image, the first image being an image based on a first wavelength range, and the second image being an image based on a second wavelength range different from the first wavelength range, a pixel value calculation step of calculating a sum of a pixel value of the first image and a pixel value of the second image for each minute region in each frame based on the first image and the second image in the plurality of frames, a proportion or difference calculation step of calculating a proportion or a difference between the pixel value of the first image and the pixel value of the second image corresponding to the minute region in a case where the sum of the pixel value of the first image and the pixel value of the second image in the minute region is the minimum in the plurality of frames, a storage step of storing the proportion or the difference calculated in the proportion or difference calculation step, a water quality data calculation step of calculating water quality data of the water quality examination target based on the proportion or the difference stored in the storage step, and a water quality distribution image generation step of generating a water quality distribution image showing a water quality distribution of the water quality examination target based on the water quality data calculated in the water quality data calculation step.

An image processing method that is still another aspect of the present invention comprises an image obtaining step of obtaining an image corresponding to a plurality of frames of the same scene in which a water quality examination target including a water surface having a wave is captured, each frame including a first image, a second image, and a third image, the first image being an image based on a first wavelength range, the second image being an image based on a second wavelength range different from the first wavelength range, and the third image being an image based on a third wavelength range which includes the first wavelength range and the second wavelength range, a pixel value obtaining step of obtaining a pixel value corresponding to a minute region constituting each third image based on the third images of the plurality of frames, a proportion or difference calculation step of calculating a proportion or a difference between the pixel value of the first image and the pixel value of the second image corresponding to the minute region in a case where the pixel value of the minute region is the minimum in the plurality of frames, a storage step of storing the proportion or the difference calculated in the proportion or difference calculation step, a water quality data calculation step of calculating water quality data of the water quality examination target based on the proportion or the difference stored in the storage step, and a water quality distribution image generation step of generating a water quality distribution image showing a water quality distribution of the water quality examination target based on the water quality data calculated in the water quality data calculation step.

It is preferable that the image processing method further comprises a wave generation step of artificially generating the wave.

According to the present aspect, the wave is artificially generated in the wave generation step. Thus, even in the case of obtaining an image of the water surface not having a natural wave, an image in which the effect of reflected light on the water surface is reduced can be generated.

A program that is still another aspect of the present invention causes a computer to execute an image processing process comprising an image obtaining step of obtaining a plurality of frame images of the same scene including a water surface having a wave, a brightness value calculation step of calculating a brightness value corresponding to a minute region constituting each frame image based on the plurality of frame images, a pixel value extraction step of extracting a pixel value corresponding to the minute region of a frame image in which the brightness value of the minute region is a brightness value lower than the brightness value of the minute region of another frame image in the plurality of frame images, a storage step of storing the pixel value extracted in the pixel value extraction step, and a composite image generation step of generating a composite image corresponding to the scene based on the pixel value stored in the storage step.

A program that is still another aspect of the present invention causes a computer to execute an image processing process comprising an image obtaining step of obtaining an image corresponding to a plurality of frames of the same scene in which a water quality examination target including a water surface having a wave is captured, each frame including a first image and a second image, the first image being an image based on a first wavelength range, and the second image being an image based on a second wavelength range different from the first wavelength range, a pixel value calculation step of calculating a sum of a pixel value of the first image and a pixel value of the second image for each minute region in each frame based on the first image and the second image in the plurality of frames, a proportion or difference calculation step of calculating a proportion or a difference between the pixel value of the first image and the pixel value of the second image corresponding to the minute region in a case where the sum of the pixel value of the first image and the pixel value of the second image in the minute region is the minimum in the plurality of frames, a storage step of storing the proportion or the difference calculated in the proportion or difference calculation step, a water quality data calculation step of calculating water quality data of the water quality examination target based on the proportion or the difference stored in the storage step, and a water quality distribution image generation step of generating a water quality distribution image showing a water quality distribution of the water quality examination target based on the water quality data calculated in the water quality data calculation step.

A program that is still another aspect of the present invention causes a computer to execute an image processing process comprising an image obtaining step of obtaining an image corresponding to a plurality of frames of the same scene in which a water quality examination target including a water surface having a wave is captured, each frame including a first image, a second image, and a third image, the first image being an image based on a first wavelength range, the second image being an image based on a second wavelength range different from the first wavelength range, and the third image being an image based on a third wavelength range which includes the first wavelength range and the second wavelength range, a pixel value obtaining step of obtaining a pixel value corresponding to a minute region constituting each third image based on the third images of the plurality of frames, a proportion or difference calculation step of calculating a proportion or a difference between the pixel value of the first image and the pixel value of the second image corresponding to the minute region in a case where the pixel value of the minute region is the minimum in the plurality of frames, a storage step of storing the proportion or the difference calculated in the proportion or difference calculation step, a water quality data calculation step of calculating water quality data of the water quality examination target based on the proportion or the difference stored in the storage step, and a water quality distribution image generation step of generating a water quality distribution image showing a water quality distribution of the water quality examination target based on the water quality data calculated in the water quality data calculation step.

According to the present invention, an image in which the effect of reflected light is reduced in a wide range of the imaged water surface is generated.

DESCRIPTION OF THE PREFERRED EMBODIMENTS

Hereinafter, an image processing apparatus, an imaging apparatus, an image processing method, and a program according to a preferred embodiment of the present invention will be described in accordance with the appended drawings.

In the related art, a water surface may be imaged by an imaging apparatus comprising a polarization filter as a technology for reducing an effect of reflected light on the water surface. The effect of the reflected light is reduced using the fact that the reflected light on the water surface is polarized to s polarized light and p polarized light, and the Brewster angle at which the reflectance of the p polarized light is equal to 0 (zero).

Figure 1:
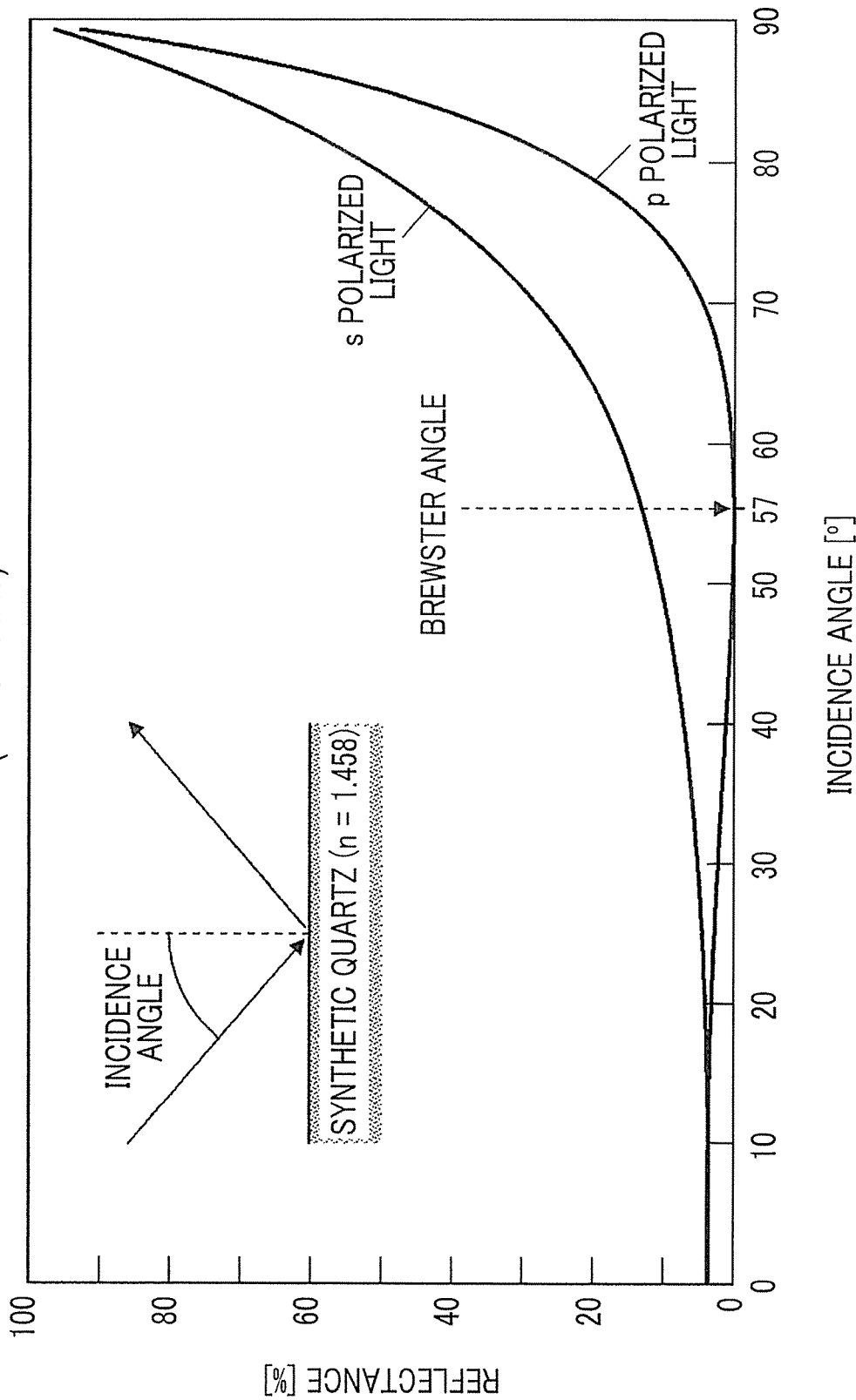
FIG. 1 is a diagram illustrating reflectances of p polarized light and s polarized light.

FIG. 1 is a diagram illustrating the reflectances of the p polarized light and the s polarized light on synthetic quartz (n=1.458). The reflectance of the s polarized light is increased as the incidence angle is increased. Meanwhile, the reflectance of the p polarized light is decreased to zero at the incidence angle of zero to the Brewster angle (in the case of synthetic quartz, 57°). The reflectance of the p polarized light is equal to zero at the Brewster angle. Then, the reflectance of the p polarized light is increased as the incidence angle is increased.

Generally, the Brewster angle is represented by Expression (1) below. Since the refractive index of water is 1.33, the Brewster angle is 53°.

$$\theta_B = \text{Arctan}\left(\frac{n2}{n1}\right) \tag{1}$$

$\theta_B$: Brewster angle $n1, n2$: Refractive index

For example, in a case where a polarization filter that blocks the s polarized light is comprised, the reflectance of the p polarized light is equal to zero in the vicinity of the Brewster angle, and the s polarized light is blocked by the polarization filter. Accordingly, a captured image in which the effect of the reflected light on the water surface is reduced is obtained.

In a case where an angle formed between an optical axis and a water surface normal line is in the vicinity of the Brewster angle, the effect of the reflected light on the water surface can be reduced as described above. However, in a case where the angle formed between the optical axis and the water surface normal line is increased above the Brewster angle, the component of the p polarized light is increased, and a case where it is difficult to reduce the effect of the reflected light occurs. That is, in a case where the angle formed between the optical axis and the water surface normal line is increased, it may be difficult to image a scene in which the effect of the reflected light is reduced even with the imaging apparatus comprising the polarization filter. The water surface normal line is a line that is normal to the water surface and intersects with the optical axis.

Next, a specific example related to the effect of the reflected light on the water surface will be described.

For example, in the field of remote sensing, water quality examination may be performed from an image obtained by imaging the water surface (for example, a sea surface, a lake surface, or a river surface) using the imaging apparatus. In this case, in a case where the effect of the reflected light from the water surface is high, accurate data of a water quality examination target cannot be obtained, and it is difficult to perform the water quality examination.

Figure 2:
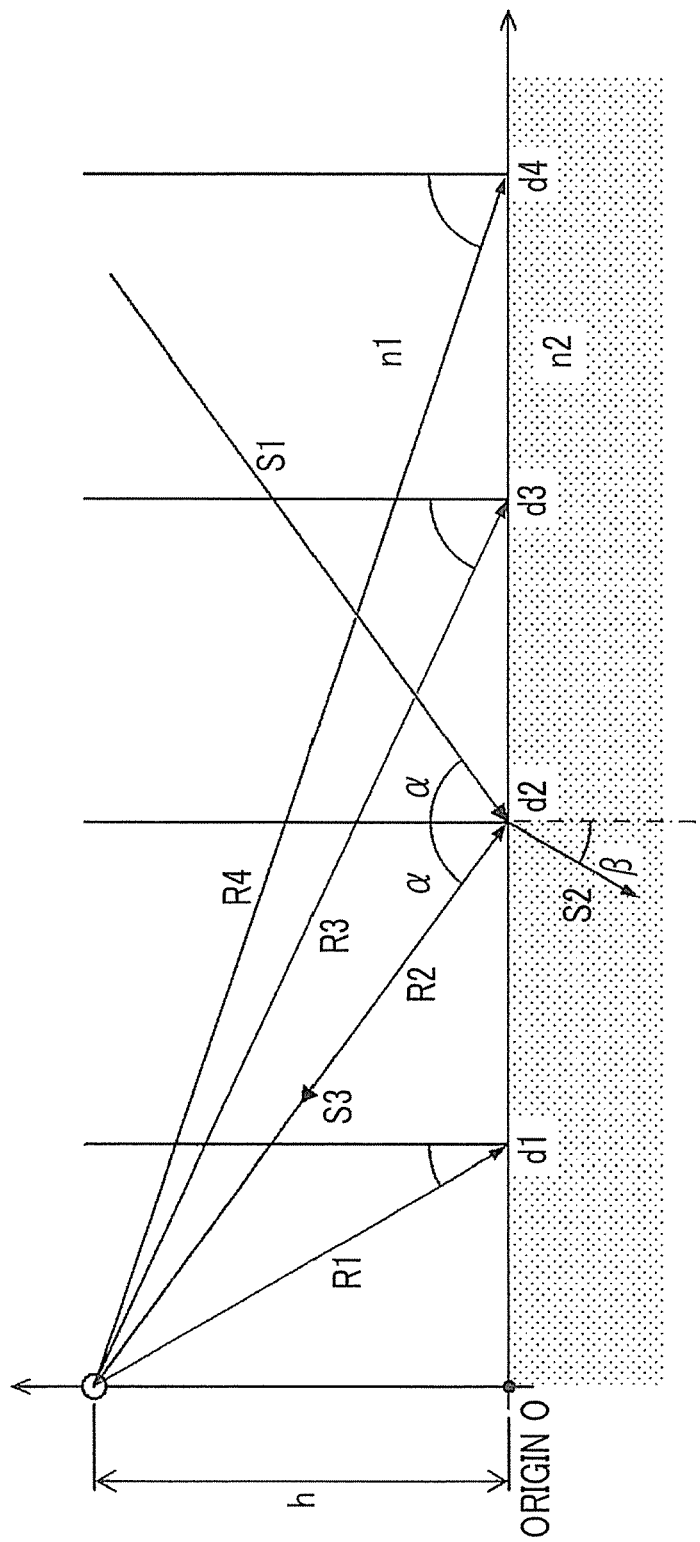
FIG. 2 is a diagram for describing calculation of a reflectance of a water surface in a case where the water surface is imaged by installing an imaging apparatus at a remote spot.

FIG. 2 is a diagram for describing calculation of the reflectance of the water surface in a case where the water surface is imaged by installing the imaging apparatus comprising the polarization filter blocking the s polarized light at a remote spot. The angle formed between the optical axis and the water surface normal line is denoted by α, and a wave does not occur on the water surface.

A case where the imaging apparatus is installed in a location in a height h and the optical axis corresponds to R1, R2, R3, and R4 is considered. In a case where the optical axis corresponds to R1, R2, R3, and R4, the water surface that is separated from an origin O by distances d1, d2, d3, and d4 is imaged. Light S1 from the sun is reflected on the water surface of d2 at the incidence angle α and becomes reflected light S3 and transmitted light S2. The reflected light S3 is reflected at the reflection angle α, and the transmitted light S2 is transmitted at a refraction angle β.

In the case of the incidence angle α and the refraction angle β, the reflectance of the p polarized light is calculated by Expression (2) and Expression (3) below. In the case illustrated in FIG. 2, the effect of the reflected light in the captured image which is obtained using the imaging apparatus comprising the polarization filter blocking the s polarized light is considered. Thus, the reflectance of the p polarized light is considered.

$$\frac{h}{d} = \tan(\alpha) \qquad (2)$$

$$R_p = \frac{n2 \times \cos\alpha - n1 \times \cos\beta}{n2 \times \cos\alpha + n1 \times \cos\beta} = \frac{\tan(\alpha - \beta)}{\tan(\alpha + \beta)} \qquad (3)$$

$Rp$: Reflectance of $p$ polarized light
$n1, n2$: Refractive index

Figure 3:
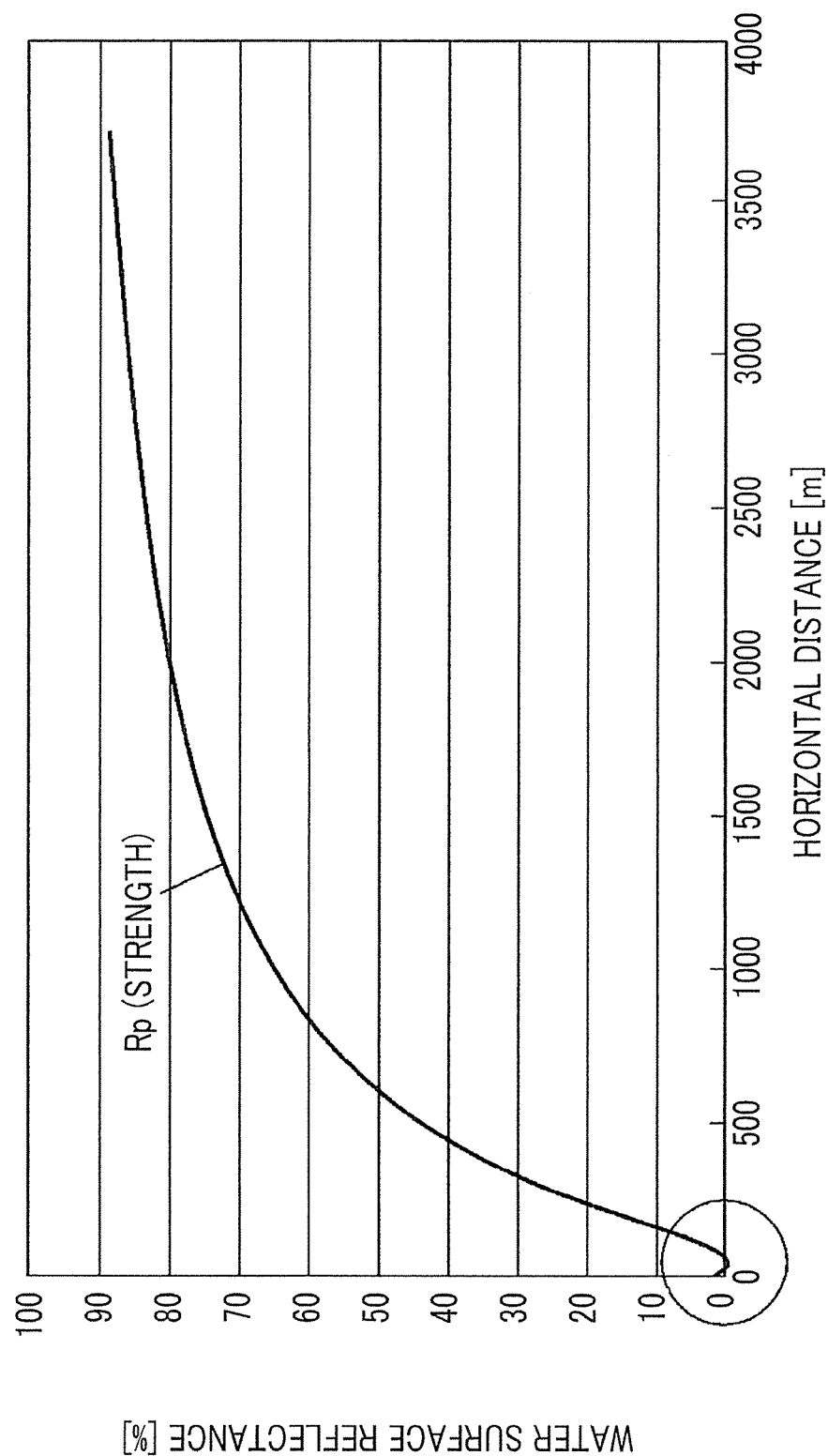
FIG. 3 is a diagram illustrating the reflectance of the water surface.
Figure 4:
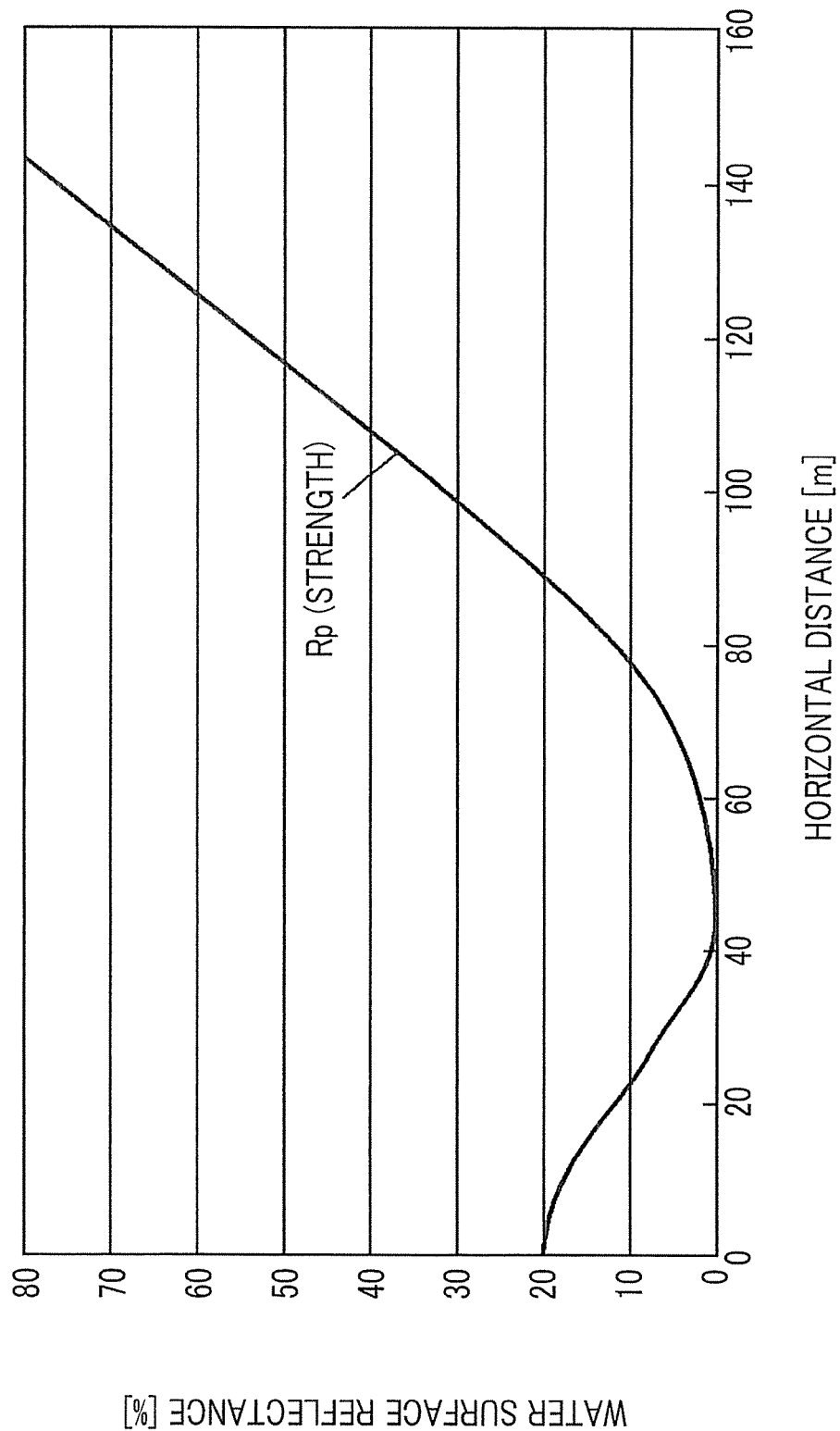
FIG. 4 is a diagram illustrating the reflectance of the water surface.

FIG. 3 and FIG. 4 are diagrams illustrating the reflectance of the water surface not having a wave in a case where the imaging apparatus is installed at an altitude of 40 m (in FIG. 2, h=40 m). FIG. 4 illustrates an enlarged view of a range of 0 m to 160 m in FIG. 3. The origin O denotes a location of an altitude of 0 m at a spot at which the imaging apparatus is installed.

As illustrated in FIG. 3 and FIG. 4, in the case of imaging a location immediately below (0 m) the location at which the imaging apparatus is comprised, surface reflection Rp is approximately 2%. Since the s polarized light is blocked by the effect of the polarization filter, the reflectance is equal to zero in a case where the water surface separated from the origin by 45 m is imaged (refer to FIG. 4).

In a case where the location to be imaged is separated from the origin by more than 45 m, the reflectance is increased. For example, the reflectance on the water surface separated by approximately 150 m exceeds 10%. The reflectance at the location separated by approximately 240 m is 20%. The reflectance at the location separated by approximately 600 m is 50%.

In the case of performing the water quality examination based on remote sensing by imaging the water surface using the imaging apparatus, the captured image in which the reflectance is reduced to 2% or lower and preferably 1% or lower is obtained, and accurate remote sensing can be performed.

Figure 5:
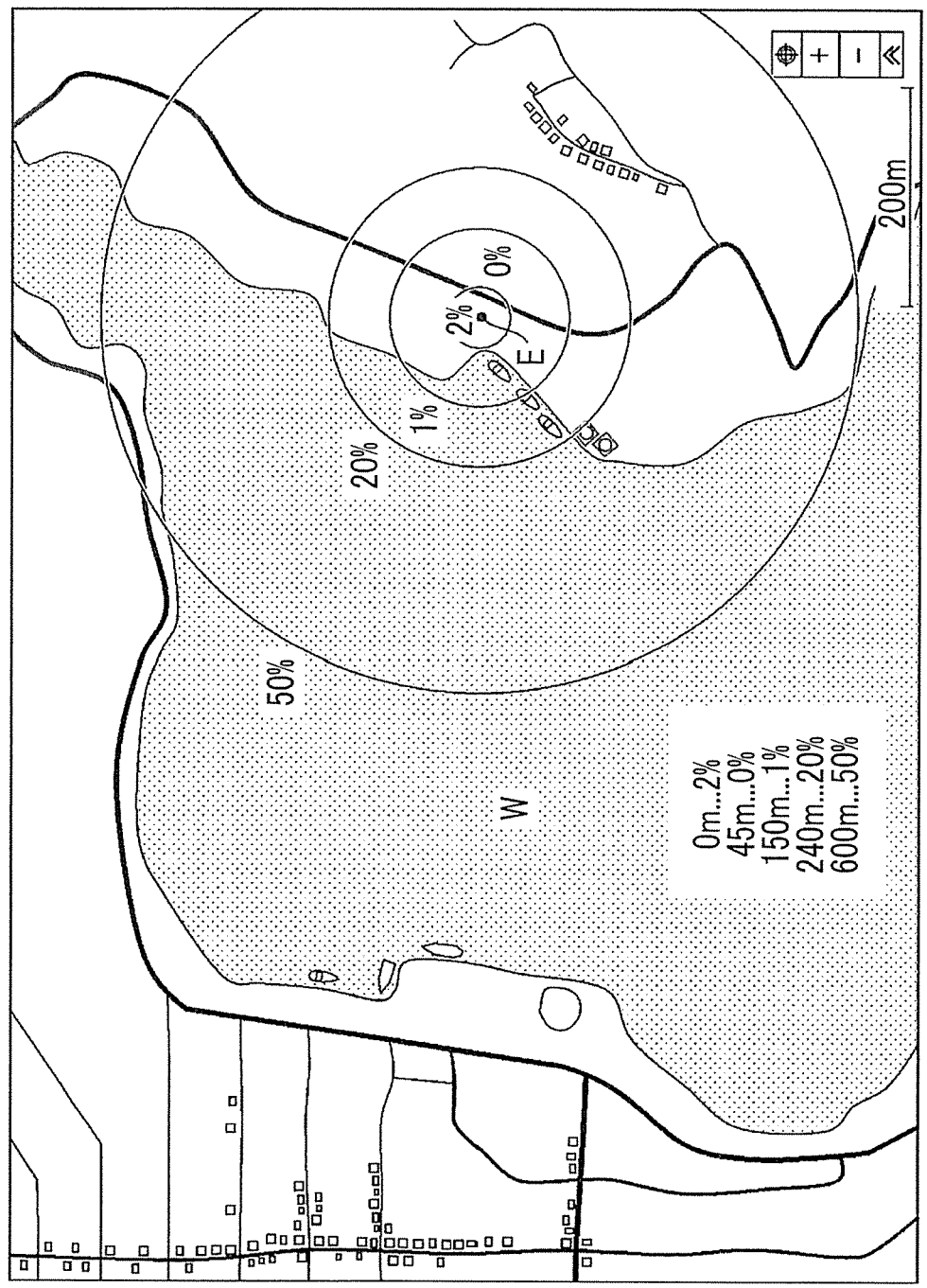
FIG. 5 is a diagram illustrating an imaging range and the reflectance.
Figure 6:
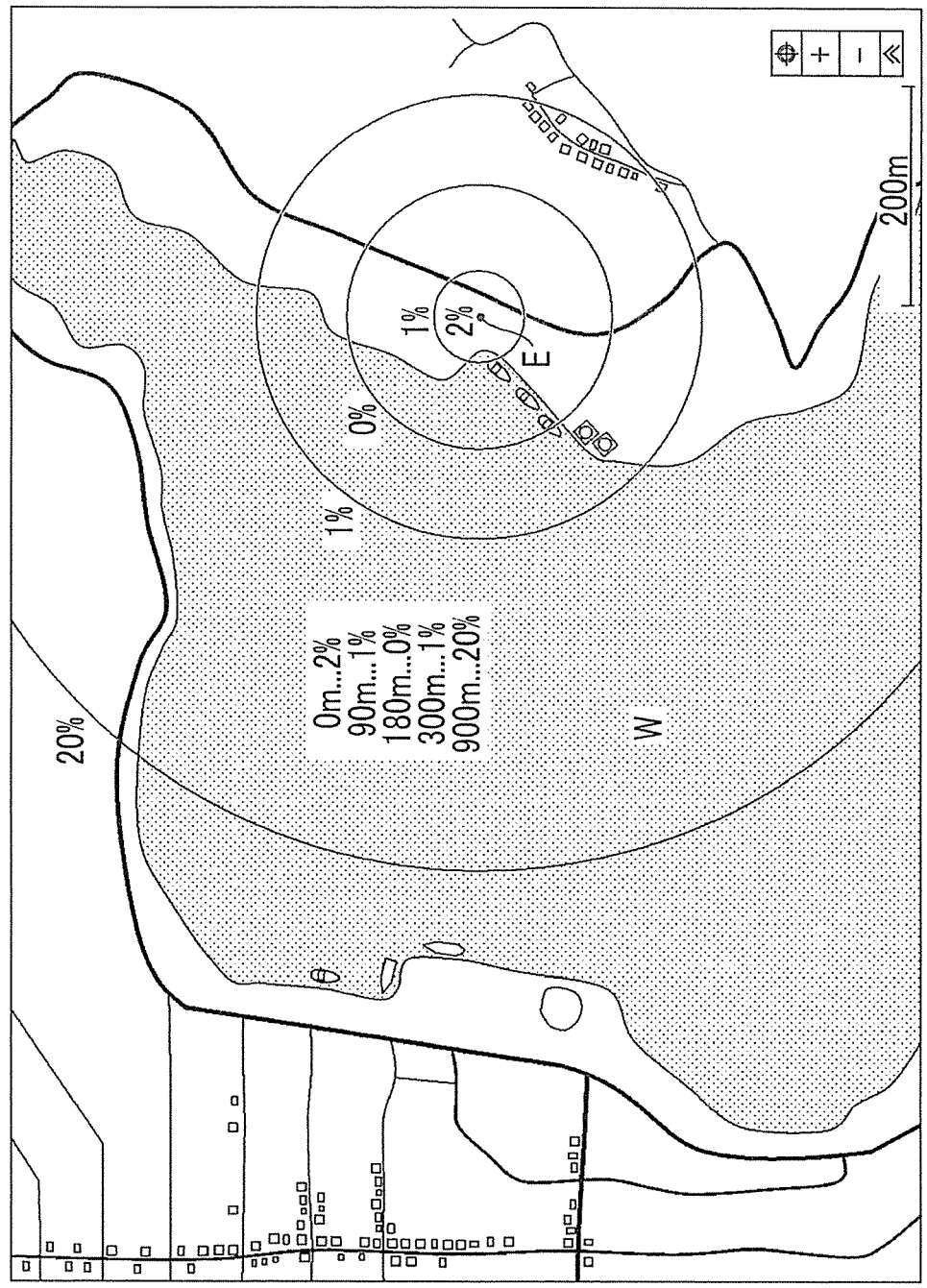
FIG. 6 is a diagram illustrating the imaging range and the reflectance.

FIG. 5 and FIG. 6 are diagrams illustrating an imaging range and the reflectance. In FIG. 5 and FIG. 6, remote sensing is performed by imaging a water surface W of a pond that is an imaging target from an imaging spot E.

In FIG. 5, the water surface W is imaged by installing an imaging apparatus 10 at the spot E of an altitude of 40 m. In the case illustrated in FIG. 5, in the case of imaging a location immediately below (0 m) the installation location of the imaging apparatus 10, the reflectance is 2%. In the range of 45 m, the incidence ray has the Brewster angle, and the reflectance is zero. In the range of 150 m, the reflectance is 1%. In the range of 240 m, the reflectance is 20%. In the range of 600 m, the reflectance is 50%. In a case where it is considered that the reflectance is reduced to 2% or lower and preferably 1% or lower in order to perform accurate water quality examination, only a narrow range of the water surface W can be imaged by the imaging apparatus 10 installed at a spot E of an altitude of 40 m.

FIG. 6 is a diagram illustrating a reflectance of an image that is captured in a case where the altitude of the installation position of the imaging apparatus 10 is increased from an altitude of 40 m to an altitude of 150 m. In a case where the installation position of the imaging apparatus is increased to an altitude of 150 m, a range in which the reflectance is 1% or lower is 300 m, and the water surface W can be imaged.

As illustrated in FIG. 5 and FIG. 6, by increasing the altitude of the installation location of a camera, the imaging range (for example, a range in which the reflectance is 2% or lower and preferably 1% or lower) in which the effect of the reflected light on the water surface is effectively reduced can be increased. However, in a case where the altitude of the installation position of the imaging apparatus is increased, problem may arise such as a building cost may be increased, scenery around the installation location may be obstructed, or it is difficult to perform maintenance of the imaging apparatus. Even in the case of imaging a lake surface using an unmanned flying object (for example, a drone) comprising the imaging apparatus, increasing the altitude may pose a problem in that an operation cost is increased, the frequency of imaging cannot be increased, or the unmanned flying object cannot fly in a severe weather.

Accordingly, the present application suggests a method of obtaining the image in which the effect of the reflected light is effectively reduced without increasing the altitude of the location at which the imaging apparatus is installed.

Figure 7:
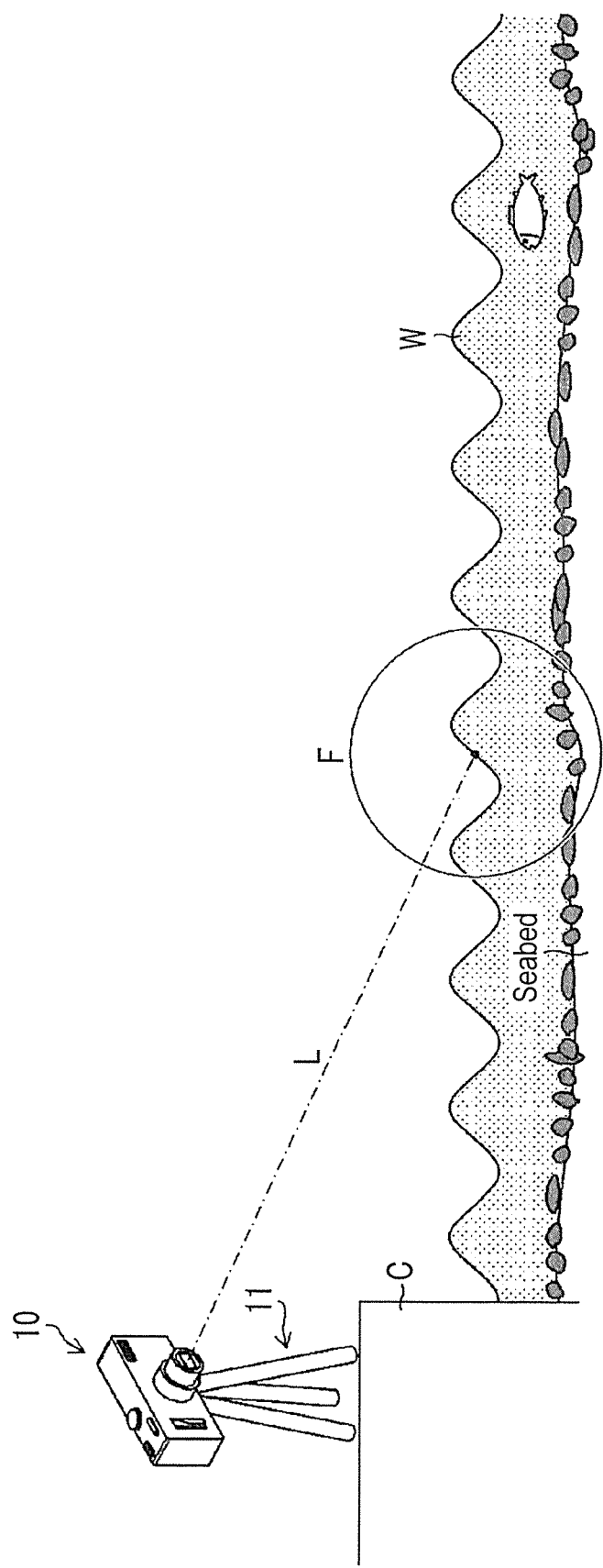
FIG. 7 is a diagram conceptually illustrating imaging of the same scene that includes the water surface having a wave.

FIG. 7 is a diagram conceptually illustrating imaging of the same scene that includes the water surface having a wave and to which the present invention is applied.

The imaging apparatus 10 is installed at a fixed point of a shore C using a tripod 11. An optical axis L of the imaging apparatus 10 is directed to the water surface W, and the water surface W is imaged from the shore C. That is, the same scene including the water surface W having a wave is imaged by the imaging apparatus 10 fixed at a fixed point.

Light from the sun is incident on the water surface W and is reflected by the surface of the water surface W. A wave occurs on the water surface W, and the incidence angle and the reflection angle of the light of the sun change along with a change in water surface caused by the wave.

The imaging apparatus 10 images the same scene for a constant time period. Specifically, the imaging apparatus 10 obtains a plurality of frames (frame images) in a moving picture mode in a state where the imaging apparatus 10 is fixed on the tripod 11.

The constant time period changes depending on the performance of an image processing apparatus 500 (FIG. 12), described below, and an image quality desired by a user. For example, the imaging apparatus 10 performs imaging for longer than or equal to 10 seconds and shorter than or equal to 120 seconds and preferably, longer than or equal to 20 seconds and shorter than or equal to 100 seconds. The imaging time period of the imaging apparatus 10 may be decided by a time period in which a composite image and a water quality distribution image generated by the image processing apparatus 500, described below, are obtained.

Figure 8:
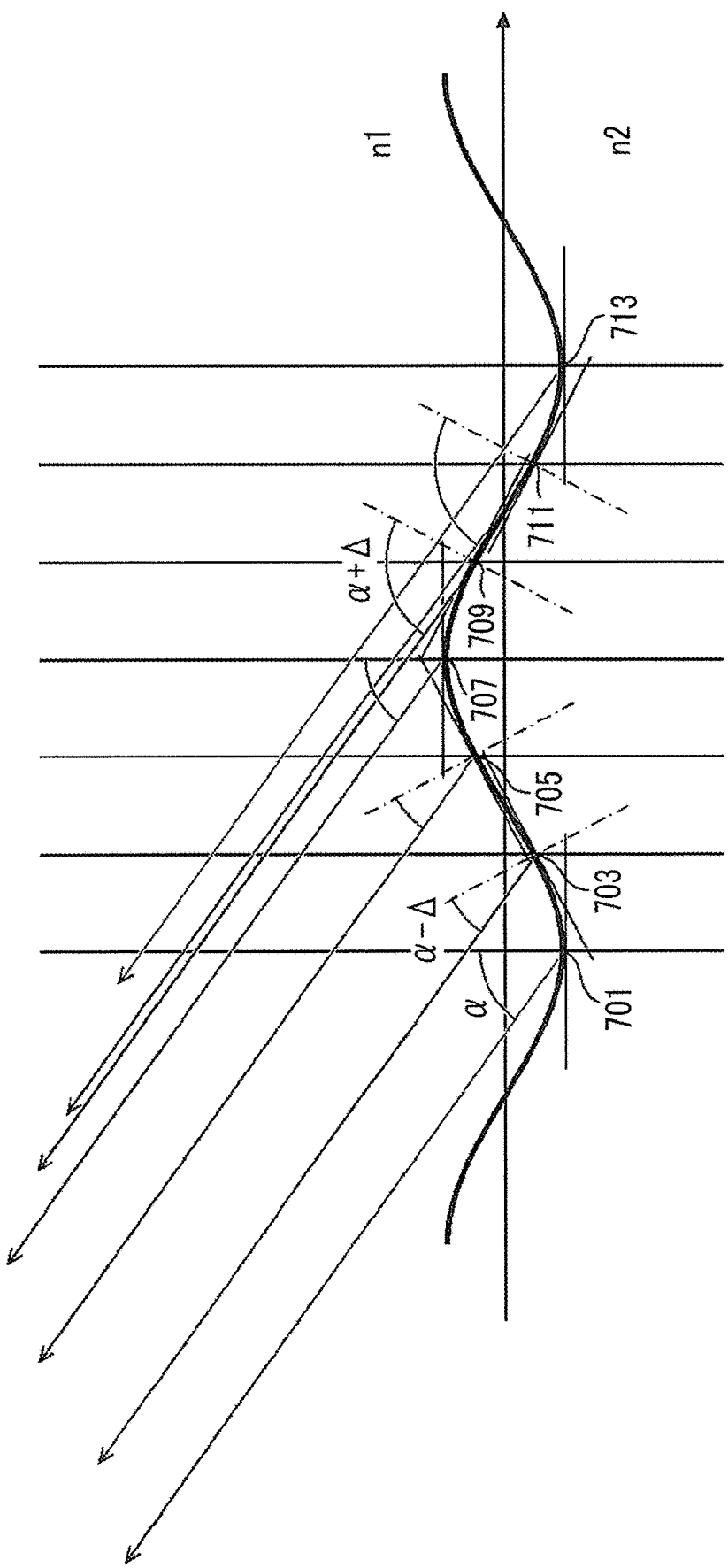
FIG. 8 is a diagram for describing an angle formed between an optical axis and a water surface normal line in a case where a wave is present on the water surface.

FIG. 8 is an enlarged view of an F region in FIG. 7 and is a diagram for describing the angle formed between the optical axis and the water surface normal line in a case where a wave is present on the water surface.

In an imaging location 701 and an imaging location 713, the optical axis L is present at a valley of the wave, and the water surface is flat. In this case, the angle formed between the optical axis and the water surface normal line is a. An imaging location 707 is an apex (peak) of the wave. In this case, the angle formed between the optical axis and the water surface normal line is also a.

In an imaging location 703 and an imaging location 705, the water surface W is inclined by the wave. Thus, the angle formed between the optical axis and the water surface normal line is $(\alpha-\Delta)$. On the other hand, in an imaging location 709 and an imaging location 711 after the apex (imaging location 707), the angle formed between the optical axis and the water surface normal line is $(\alpha+\Delta)$. The angle $\alpha$ formed between the optical axis L and the water surface normal line changes depending on the presence of the wave on the water surface W.

In a natural environment, water surfaces such as a lake surface, a sea surface, and a river surface are unlikely to be completely flat, and waves occur. In the water surface on which the wave occurs, the angle between the water surface normal line and the optical axis varies, and the reflectance of the water surface varies in connection with the angle. In an imaging location or a moment in which the water surface is inclined toward the imaging apparatus 10 like the imaging location 703 and the imaging location 705 illustrated in FIG. 8, a change in shape of the water surface W caused by the wave works in a direction in which the angle between the water surface and the optical axis of the camera does not exceed the Brewster angle. Accordingly, the effect of the reflected light on the water surface is reduced in a case where an observation target object in water is imaged by successfully extracting a moment in which the optical axis and the water surface normal line are at the Brewster angle or in the vicinity of the Brewster angle. Particularly, in the captured image in a moment in which the inclination of the water surface normal line caused by the wave is significant and the angle formed between the optical axis and the water surface normal line is less than or equal to the Brewster angle, the effect of the polarization filter can be exhibited to the maximum, and the target object in water can be observed and imaged without the effect of the reflected light on the water surface (without the light of the observation target buried in the reflected light).

The whole range of the observation target does not satisfy the above convenient condition at the same time. Therefore, multiple images are captured, and optimal frames and locations are selected by image processing. That is, since the reflected component on the water surface is reduced as the condition of the Brewster angle is more satisfied, the same position on the water surface is observed and compared in a certain time period. In a first embodiment, a case where a luminance value is the lowest is determined as most satisfying the condition of the Brewster angle. In a second embodiment, a case where the sum of a pixel value of a first image and a pixel value of a second image is minimized is determined as most satisfying the condition of the Brewster angle. In a third embodiment, a case where a pixel value of a third image is minimized is determined as most satisfying the condition of the Brewster angle. This process is performed on all minute regions (pixels) of an observation screen. The wave may be a natural wave or may be an artificial wave generated by a wave generator and the like. In the case of generating an artificial wave, it is preferable to generate a wave having a concentric circle shape in which the installation position (connection point between the installation position and the water surface) of the imaging apparatus 10 is at the center of the concentric circle formed by the wave. In a case where the inclination direction (direction of the water surface normal line) of the wave is directed to the imaging apparatus 10 by generating the wave having the concentric circle shape centered at the installation position of the imaging apparatus 10, the effect of reflection can be more effectively reduced.

Figure 9:
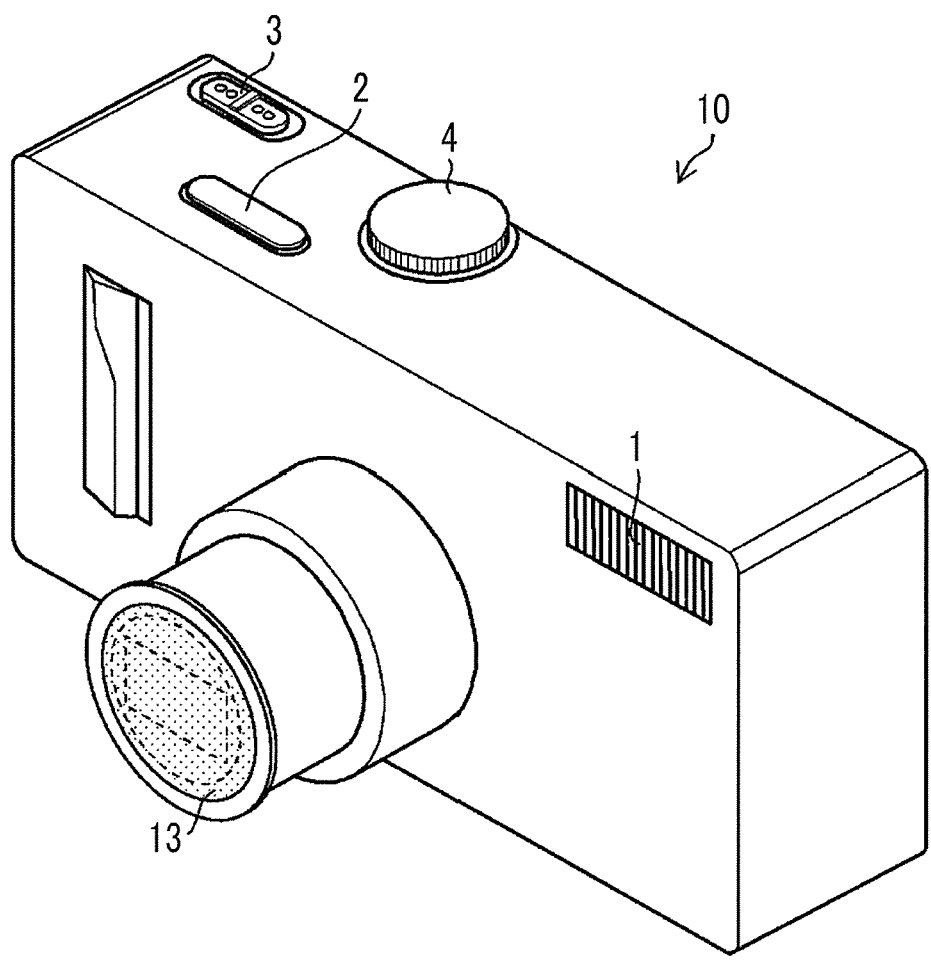
FIG. 9 is a perspective view illustrating an embodiment of the imaging apparatus.
Figure 10:
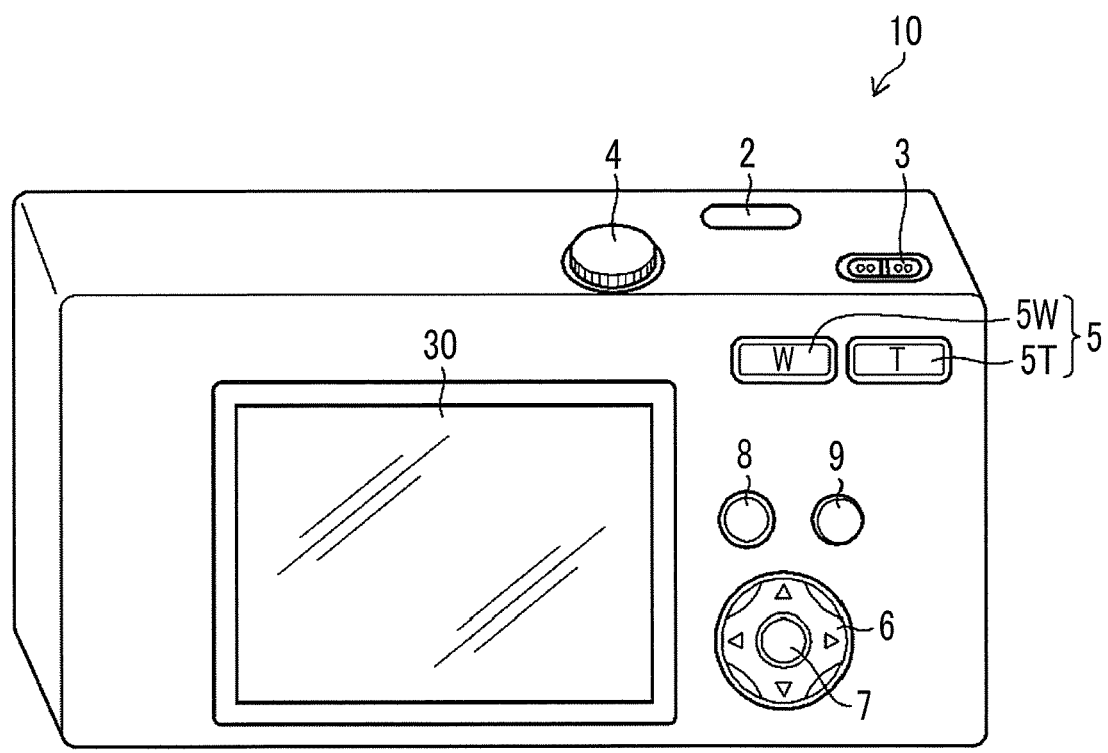
FIG. 10 is a rear view illustrating the embodiment of the imaging apparatus.

FIG. 9 and FIG. 10 are respectively a perspective view and a rear view illustrating the imaging apparatus 10 of the embodiment of the present invention. The imaging apparatus 10 is a digital camera or a digital video camera that receives light passing through a lens by an imaging element, converts the light into a digital signal, and records the digital signal on recording media as image data of a still picture or a moving picture.

As illustrated in FIG. 9, in the imaging apparatus 10, an imaging lens (optical system) 12, a strobe 1, and the like are arranged on its front surface, and a shutter button 2, a power supply/mode switch 3, a mode dial 4, and the like are arranged on its upper surface. As illustrated in FIG. 10, a liquid crystal monitor (liquid crystal display (LCD)) 30, a zoom button 5, a cross button 6, a MENU/OK button 7, a playback button 8, a BACK button 9, and the like are arranged on the camera rear surface.

The imaging lens 12 is composed of a retractable zoom lens and is withdrawn from the camera main body by setting the mode of the camera to an imaging mode by the power supply/mode switch 3. The strobe 1 radiates strobe light toward a main subject.

The shutter button 2 is configured with a so-called 2-stage stroke switch including "half push (S1 ON)" and "full push (S2 ON)". The shutter button 2 functions as an imaging preparation instruction unit and functions as an image recording instruction unit.

In a case where a motion picture imaging mode is selected as the imaging mode, and the shutter button 2 is "fully pushed", the imaging apparatus 10 starts picture recording of a motion picture. In a case where the shutter button 2 is "fully pushed" again, the imaging apparatus 10 stops the picture recording and is set to be in a standby state. In a case where the motion picture imaging mode is selected, focal point adjustment is consecutively performed by performing automatic focal point adjustment through a lens drive unit 36, and exposure control is performed by performing automatic exposure control through a shutter drive unit 33 and a stop drive unit 34.

In a case where a still picture imaging mode is selected as the imaging mode and the shutter button 2 is subjected to the "half push", the imaging apparatus 10 performs an imaging preparation operation of performing autofocus (AF) and/or automatic exposure (AE) control. In a case where the shutter button 2 is subjected to the "full push", the imaging apparatus 10 images and records a still picture.

The power supply/mode switch 3 has a function as a power supply switch for setting a power supply of the imaging apparatus 10 to be ON/OFF and a function as a mode switch for setting the mode of the imaging apparatus 10. The power supply/mode switch 3 is arranged to be slidable among an "OFF position", a "playback position", and an "imaging position". The power supply of the imaging apparatus 10 is switched ON by sliding the power supply/mode switch 3 to the "playback position" or the "imaging position". The power supply of the imaging apparatus 10 is switched OFF by sliding the power supply/mode switch 3 to the "OFF position". Sliding the power supply/mode switch 3 to the "playback position" sets a "playback mode", and sliding the power supply/mode switch 3 to the "imaging position" sets the "imaging mode".

The mode dial 4 functions as imaging mode setting means for setting the imaging mode of the imaging apparatus 10. The imaging mode of the imaging apparatus 10 is set to various modes depending on the setting position of the mode dial 4. For example, the "still picture imaging mode" for performing still picture imaging and the "motion picture imaging mode" for performing motion picture imaging are present. For example, the plurality of frame images in the embodiment of the present invention are obtained in the motion picture imaging mode.

The liquid crystal monitor 30 displays a live view image (through-image) at the time of the imaging mode, displays a still picture or a motion picture at the time of the playback mode, and functions as a part of a graphical user interface (GUI) by displaying a menu screen and the like.

The zoom button 5 functions as zoom instruction means for providing an instruction to zoom and includes a tele button 5T providing an instruction to zoom to a telephoto side and a wide button 5W providing an instruction to zoom to a wide angle side. In the imaging apparatus 10, the focal length of the imaging lens 12 is changed by operating the tele button 5T and the wide button 5W at the time of the imaging mode. In addition, the image during its playback is enlarged or shrunk by operating the tele button 5T and the wide button 5W at the time of the playback mode.

The cross button 6 is a multifunction button for inputting instructions in four directions of upward, downward, leftward, and rightward directions. The cross button 6 functions as a button (cursor movement operation means) for selecting an item from the menu screen or providing an instruction to select various setting items from each menu. A left/right key functions as a frame forwarding (forward direction/backward direction forwarding) button at the time of the playback mode.

The MENU/OK button 7 is an operation button having functions of both a menu button for providing an instruction to display the menu on the screen of the liquid crystal monitor 30 and an OK button for providing an instruction to confirm and execute the content of selection and the like.

The playback button 8 is a button for switching to the playback mode for displaying the imaged and recorded still picture or the motion picture on the liquid crystal monitor 30.

The BACK button 9 functions as a button providing an instruction to cancel an input operation or return to the immediately previous operation state.

Figure 11:
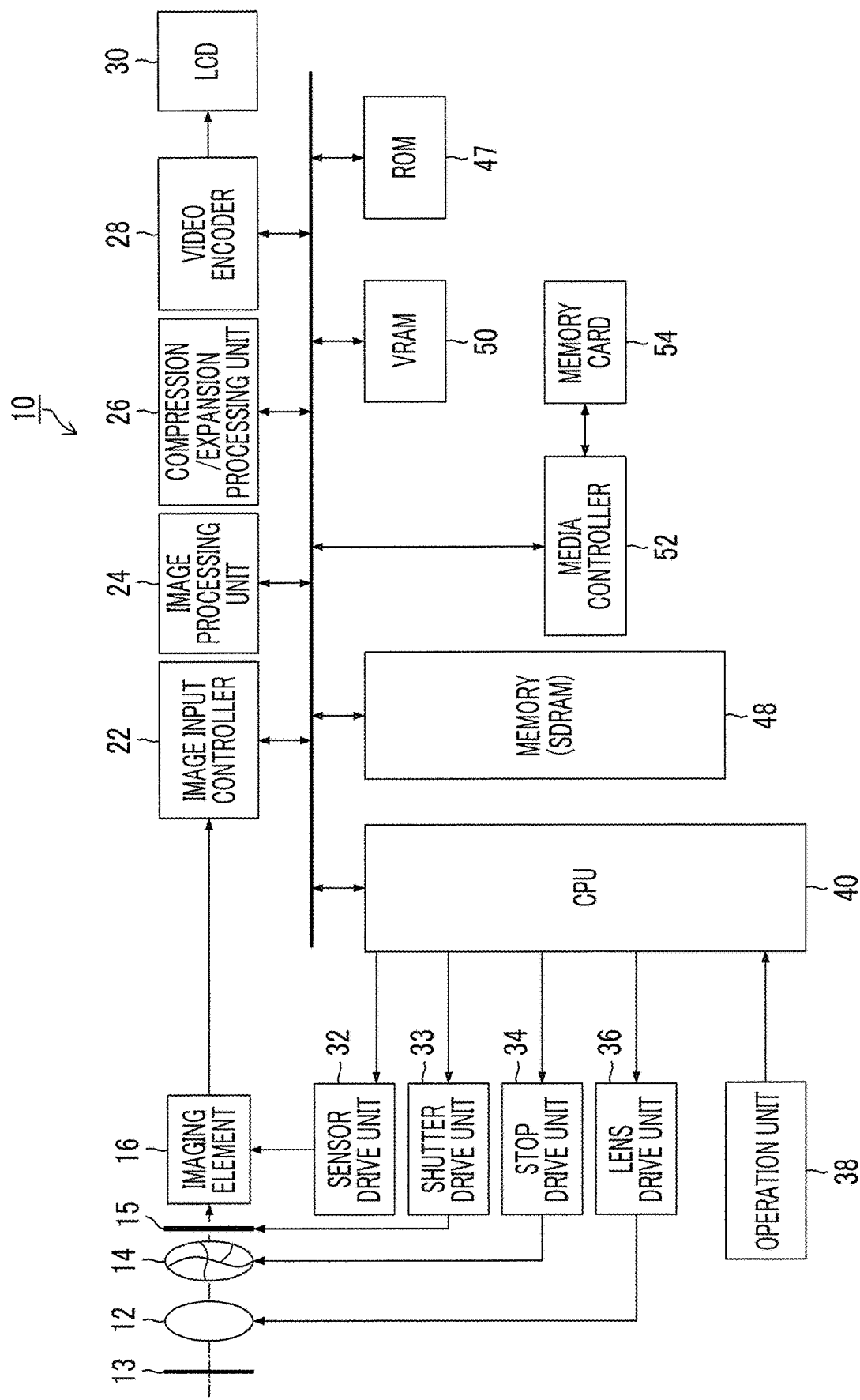
FIG. 11 is a block diagram illustrating an embodiment of an internal configuration of the imaging apparatus.

FIG. 11 is a block diagram illustrating an embodiment of an internal configuration of the imaging apparatus 10. The imaging apparatus 10 records the captured image on a memory card 54, and the operation of the whole apparatus is managed and controlled by a central processing unit (CPU) 40.

An operation unit 38 such as the shutter button 2, the power supply/mode switch 3, the mode dial 4, the tele button 5T, the wide button 5W, the cross button 6, the MENU/OK button 7, the playback button 8, and the BACK button 9 is disposed in the imaging apparatus 10. A signal from the operation unit 38 is input into the CPU 40, and the CPU 40 controls each circuit of the imaging apparatus 10 based on the input signal. For example, the CPU 40 performs drive control (sensor drive unit 32) of an imaging element (image sensor) 16, lens drive control (lens drive unit 36), stop drive control (stop control unit 34), imaging operation control, image processing control, recording/playback control of the image data, and display control of the liquid crystal monitor 30.

In a case where the power supply of the imaging apparatus 10 is switched ON by the power supply/mode switch 3, power is supplied to each block from a power supply unit, not illustrated, and driving of the imaging apparatus 10 is started.

A luminous flux passing through the imaging lens 12, a stop 14, a mechanical shutter 15, and the like is imaged in the imaging element 16 that is a complementary metal-oxide semiconductor (CMOS) type color image sensor. The imaging element 16 is not limited to a CMOS type and may be a color image sensor of an XY address type or a charge coupled device (CCD) type.

A polarization filter 13 is disposed in front of the imaging lens 12. A luminous flux of the same scene including the water surface which is the imaging target and has the wave passes through the polarization filter 13. The polarization filter 13 has at least a function of blocking the s polarized light reflected on the water surface.

The imaging element 16 is configured with a plurality of pixels that are arranged in matrix form in a predetermined pattern arrangement (Bayer arrangement). Each pixel is configured to include a microlens, a color filter CF of red (R), green (G), or blue (B), and a photodiode PD. The imaging element 16 may comprise a filter through which light of a first wavelength range, a second wavelength range, or a third wavelength range, described below, is transmitted.

The CPU 40 performs an AF operation and an AE operation at all times during imaging and/or recording (picture recording) of the motion picture and during imaging and/or display of the live view image.

In addition, a ROM 47 is a read only memory (ROM) or an electrically erasable programmable read-only memory (EEPROM) in which a camera control program, defect information related to the imaging element 16, and various parameters and tables used in image processing and the like are stored.

The image data (mosaic image data) of RGB output from the imaging element 16 at the time of imaging the motion picture or the still picture is input and temporarily stored in a memory (synchronous dynamic random access memory (SDRAM)) 48 from an image input controller 22.

The image data temporarily stored in the memory 48 is appropriately read by an image processing unit 24 and is subjected to signal processing such as an offset process, a gain control process including white balance correction and sensitivity correction, gamma-correction processing, a demosaicing process (demosaicing), and RGB and/or YC conversion process.

The image data processed by the image processing unit 24 is input into a video RAM (VRAM) 50. The VRAM 50 includes an A region and a B region. Image data representing an image of one frame is recorded in each of the A region and the B region. In the VRAM 50, the image data representing the image of one frame is alternately rewritten between the A region and the B region. The written image data is read from a region of the A region and the B region of the VRAM 50 other than a region in which the image data is rewritten.

The image data read from the VRAM 50 is encoded in a video encoder 28 and is output to the liquid crystal monitor 30 disposed on the camera rear surface. Accordingly, the live view image is continuously displayed on the display screen of the liquid crystal monitor 30.

A compression/expansion processing unit 26 performs a compression process on brightness data Y and color difference data Cb and Cr that are processed by the image processing unit 24 and are temporarily stored in the memory 48 at the time of recording the motion picture or the still picture. In the case of the motion picture, for example, the compression is performed in the H.264 format. In the case of the still picture, for example, the compression is performed in the Joint Photographic Experts Group (JPEG) format. The compression image data compressed by the compression/expansion processing unit 26 is recorded on the memory card 54 through a media controller 52.

In addition, the compression/expansion processing unit 26 performs an expansion process on the compression image data obtained from the memory card 54 through the media controller 52 at the time of the playback mode. For example, the media controller 52 records and reads the compression image data in the memory card 54.

First Embodiment

Figure 12:
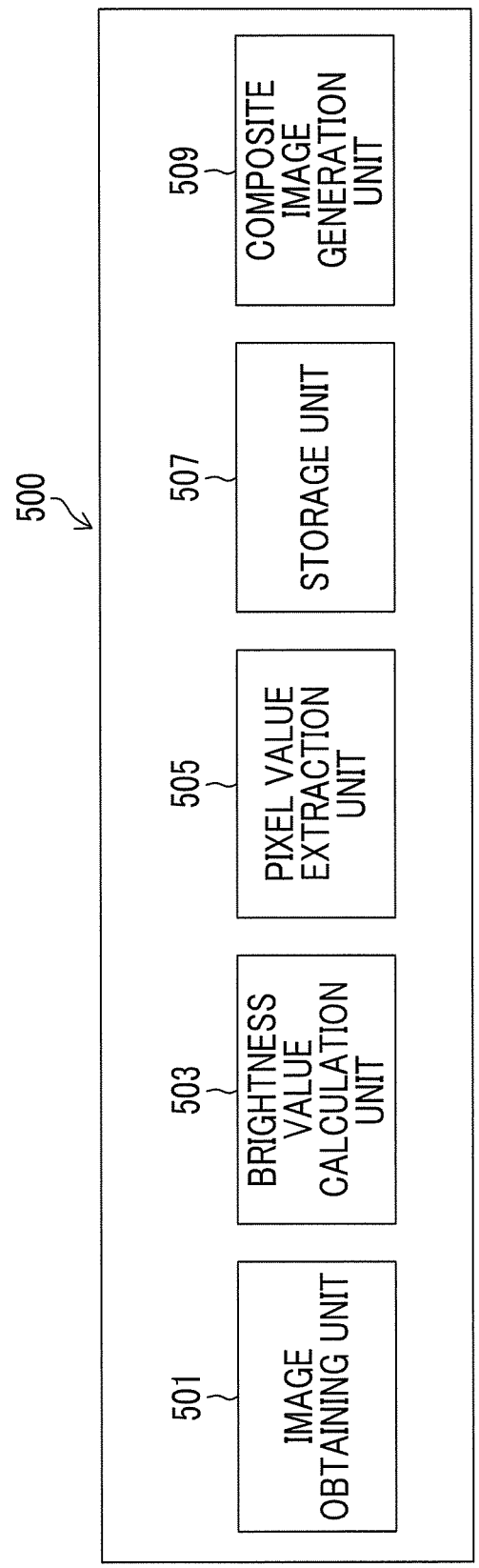
FIG. 12 is a diagram illustrating a function block diagram of an image processing apparatus.

FIG. 12 is a diagram illustrating a function block diagram of the image processing apparatus 500 according to the embodiment of the present invention.

The image processing apparatus 500 comprises an image obtaining unit 501, a brightness value calculation unit 503, a pixel value extraction unit 505, a storage unit 507, and a composite image generation unit 509. For example, the image processing apparatus 500 is comprised in the imaging apparatus 10. For example, the image processing apparatus 500 may be disposed in a computer. In that case, the plurality of frame images captured by the camera (for example, the imaging apparatus 10) are input into the computer.

The image obtaining unit 501 obtains the plurality of frame images of the same scene including the water surface having the wave. For example, the image obtaining unit 501 obtains the image data of the frame images after signal processing in the image processing unit 24. For example, the image obtaining unit 501 is implemented by the image processing unit 24.

The brightness value calculation unit 503 calculates a brightness value corresponding to the minute region constituting each frame image based on the plurality of frame images. For example, the brightness value calculation unit 503 is implemented by the image processing unit 24 and calculates the brightness value of each frame image. The minute region is a region in the frame image. Regions of various ranges are employed as the minute region. For example, the minute region is a region of one pixel constituting the frame image.

The pixel value extraction unit 505 extracts a pixel value corresponding to the minute region of the frame image of which the brightness value of the minute region is a lower brightness value than the brightness value of the minute region of another frame image in the plurality of frame images. The best form is extracting the pixel value corresponding to the minute region in a case where the brightness value of the minute region is the minimum in the plurality of frame images. That is, the pixel value extraction unit 505 obtains the brightness value of the minute region of each frame image, compares the brightness value at the same position among the plurality of frame images, and extracts the brightness value of the minute region in a case where the brightness value is the minimum. In this case, for example, the pixel value is information related to the color of the pixel.

The storage unit 507 stores the pixel value extracted by the pixel value extraction unit 505. For example, the storage unit 507 is implemented by the memory 48. The pixel value of the minute region extracted by the pixel value extraction unit 505 in a case where the brightness value is the minimum is sequentially stored.

The composite image generation unit 509 generates a composite image corresponding to the scene based on the pixel value stored in the storage unit 507. For example, the composite image generation unit 509 is implemented by the video encoder 28.

Figure 13:
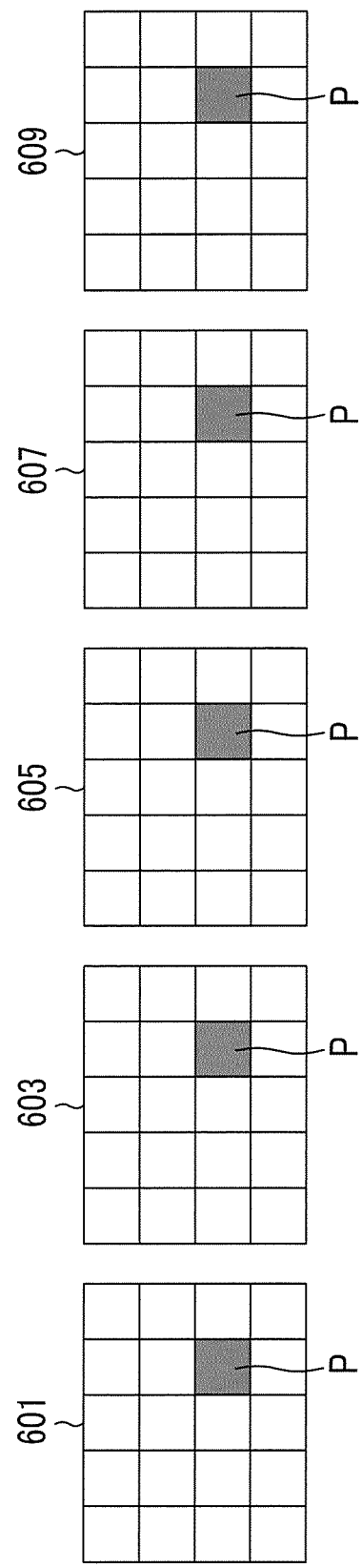
FIG. 13 is a diagram for describing extraction of a pixel value.

FIG. 13 is a diagram for describing the extraction of the pixel value by the pixel value extraction unit 505. In FIG. 13, for description, five frame images are illustrated as the plurality of frame images. In actuality, a further large number of frame images are obtained by the image obtaining unit 501. In addition, in FIG. 13, the frame image configured with 4×5 pixels is schematically illustrated. In actuality, the frame image is configured with a larger number of pixels.

The image obtaining unit 501 obtains a first frame image 601, a second frame image 603, a third frame image 605, a fourth frame image 607, and a fifth frame image 609 in which the same scene is captured.

The brightness value calculation unit 503 calculates the brightness value of the pixel at a position P of the first frame image 601. The brightness value of the pixel at the position P of the first frame image 601 is stored in the storage unit 507 as an initial value. Then, the pixel value of the pixel at the position P of the second frame image 603, the third frame image 605, the fourth frame image 607, and the fifth frame image 609 is sequentially calculated. The position P in each frame image denotes the same position.

While the pixel value is sequentially calculated by the brightness value calculation unit 503, the pixel value of the frame image in a case where the brightness value of the pixel at the position P is the minimum is extracted by the pixel value extraction unit 505. In the case illustrated in FIG. 13, for example, the pixel value extraction unit 505 determines that the brightness value at the position P of the fifth frame image 609 is the minimum, and extracts the pixel value at the position P of the fifth frame image 609. The extracted pixel value is stored in the storage unit 507.

Figure 14B:
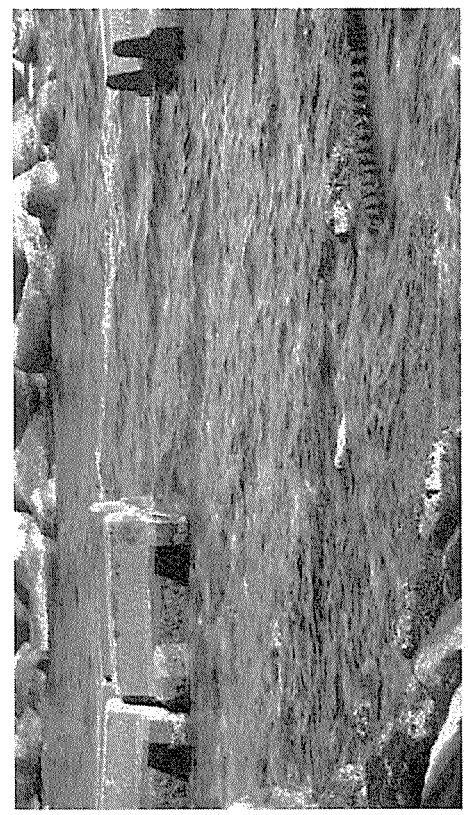
FIGS. 14A and 14B are conceptual diagrams illustrating an original image and a composite image.
Figure 14A:

FIGS. 14A and 14B are conceptual diagrams illustrating an original image and the composite image generated by the composite image generation unit 509. FIG. 14A illustrates the original image, and FIG. 14B illustrates the composite image. The same scene is captured in both images. The original image is an image subjected to typical image processing, and the effect of the reflected light on the water surface is not reduced. In a case where the effect of the reflected light on the water surface is significant like the original image, light from the observation target object in water is buried in the reflected light on the water surface, and appropriate observation cannot be performed. Meanwhile, the pixel value in the case of the minimum brightness value in each frame image is extracted, and the composite image is configured with the extracted pixel value. Thus, the effect of the reflected light on the water surface is reduced in the composite image, and light from the observation target object in water can be appropriately captured.

Figure 15:
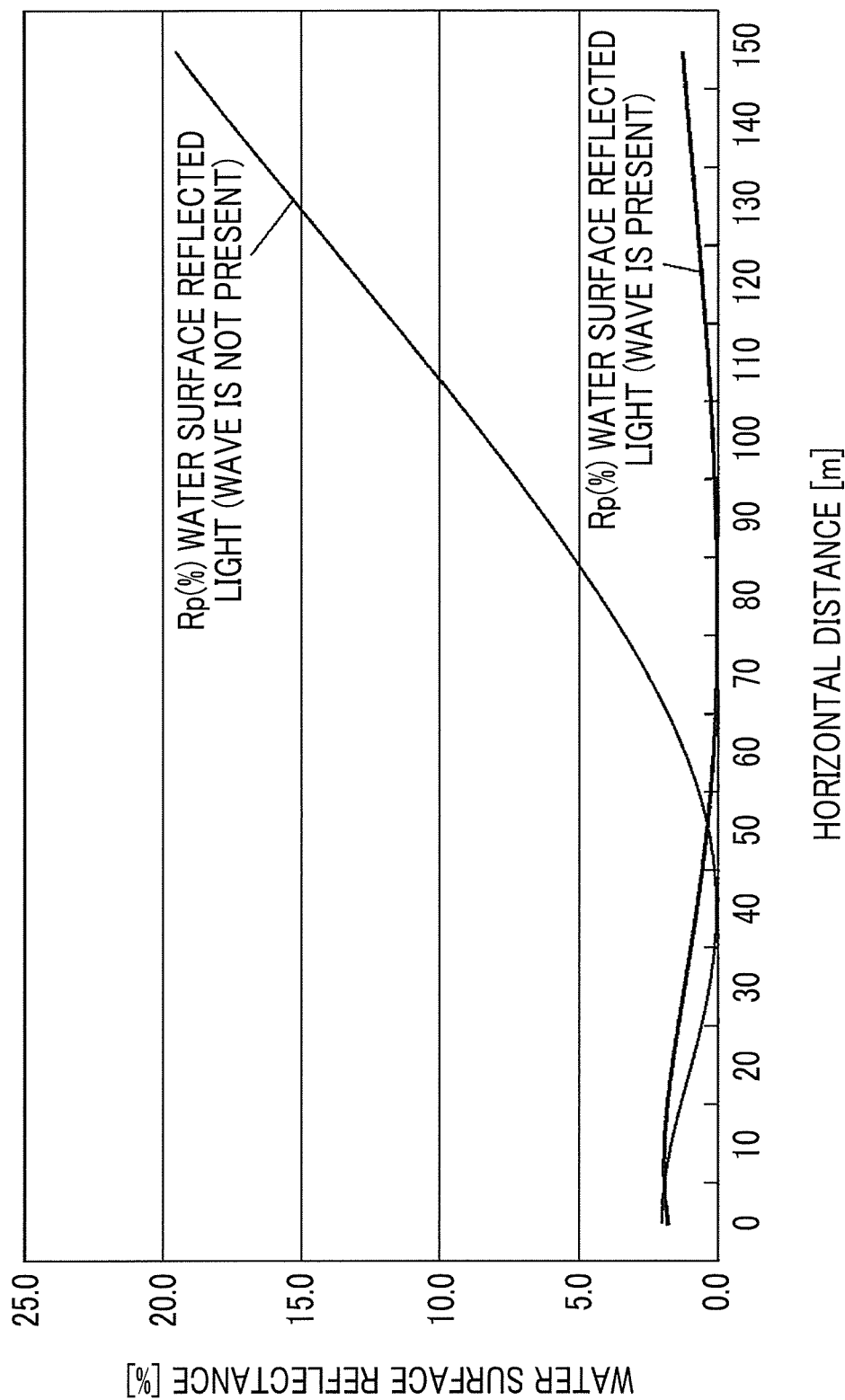
FIG. 15 is a diagram illustrating a reflectance of reflected light on the water surface in a case where a wave is not present and the reflectance of the reflected light on the water surface in a case where a wave is present.

FIG. 15 is a diagram illustrating the reflectance of the reflected light on the water surface in a case where the wave is not present and the reflectance of the reflected light on the water surface in a case where the wave is present. The reflectance is measured using an image that is obtained from the water surface having the wave of a maximum water surface angle of 15° by installing the imaging apparatus 10 comprising the polarization filter 13 in a location of an altitude of 30 m. The image from which the reflectance is measured is measured using the image generated by the composite image generation unit 509.

The reflectance of the reflected light on the water surface in a case where the wave is not present is approximately 0 around a horizontal distance of 40 m. Then, the reflectance is increased as the horizontal distance is increased. The reflectance of the reflected light on the water surface in a case where the wave is present does not increase even in a case where the horizontal distance is increased. It is perceived that in the composite image, the effect of the reflected light can be reduced in the case of the water surface having the wave.

Figure 16:
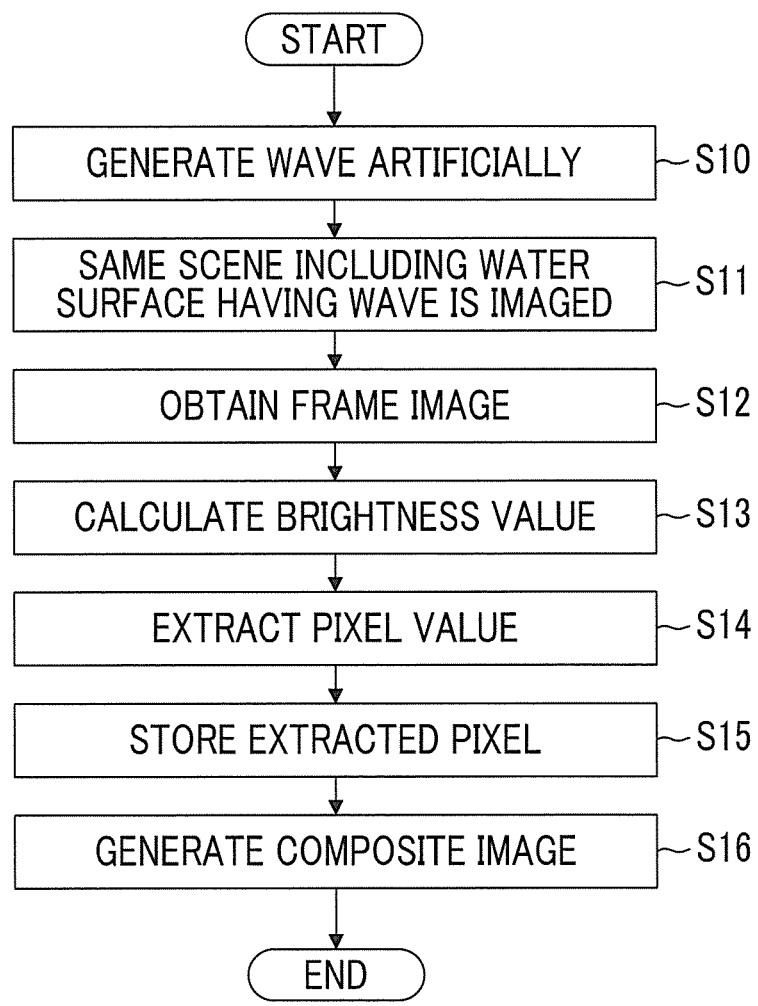
FIG. 16 is a flowchart illustrating an operation of the image processing apparatus.

FIG. 16 is a flowchart illustrating an operation of the image processing apparatus 500.

First, in a case where the wave is not present on the water surface, the wave is artificially generated. For example, the wave is generated on the water surface by the wave generator (wave generation step: step S10). Then, the same scene including the water surface having the wave is imaged by the imaging apparatus 10 (step S11). The plurality of frame images in which the same scene including the water surface having the wave is captured are obtained by the image obtaining unit 501 (image obtaining step: step S12).

Next, the brightness value in the minute region is calculated by the brightness value calculation unit 503 (brightness value calculation step: step S13). Then, the pixel value corresponding to the minute region in a case where the brightness value of the minute region is the minimum in the plurality of frame images is extracted by the pixel value extraction unit 505 (pixel value extraction step: step S14). Then, the extracted pixel is stored in the storage unit 507 (storage step: step S15). Then, the composite image generation unit generates the composite image corresponding to the obtained same scene based on the pixel value stored in the storage unit 507 (composite image generation step: step S16).

In the embodiment, a hardware structure of processing units executing various processes corresponds to various processors illustrated below. The various processors include a central processing unit (CPU) that is a general-purpose processor functioning as various processing units by executing software (program), a programmable logic device (PLD) such as a field programmable gate array (FPGA) that is a processor of which a circuit configuration can be changed after manufacturing, a dedicated electric circuit such as an application specific integrated circuit (ASIC) that is a processor having a circuit configuration dedicatedly designed to execute a specific process, and the like.

One processing unit may be configured with one of the various processors or may be configured with two or more processors of the same type or different types (for example, a plurality of FPGAs or a combination of the CPU 40 and an FPGA). In addition, a plurality of processing units may be configured with one processor. A first example of configuring a plurality of processing units with one processor is such that one processor is configured with a combination of one or more CPUs 40 and software, and the processor functions as the plurality of processing units, as represented by a computer such as a client or a server. A second example is such that a processor that implements the function of the whole system including the plurality of processing units using one integrated circuit (IC) is used, as represented by a system on chip (SoC) or the like. Various processing units are configured using one or more of the various processors as a hardware structure.

Furthermore, the hardware structure of the various processors is more specifically circuitry in which circuit elements such as a semiconductor element are combined.

Each configuration and each function described above can be appropriately implemented by any hardware, software, or a combination of both hardware and software. For example, the present invention can also be applied to a program that causes a computer to execute the process steps (process procedure) described above, a computer-readable recording medium (non-transitory recording medium) on which the program is recorded, or a computer on which the program can be installed.

Second Embodiment

Next, the second embodiment of the present invention will be described.

Figure 17:
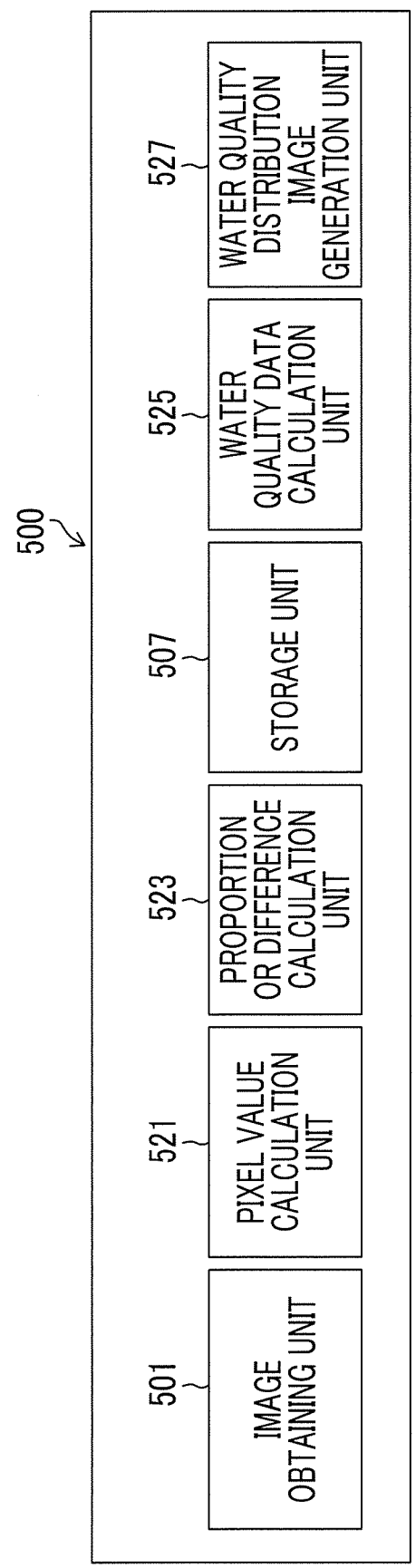
FIG. 17 is a diagram illustrating a function block diagram of the image processing apparatus.

FIG. 17 is a diagram illustrating a function block diagram of the image processing apparatus 500 according to the embodiment of the present invention. Descriptions of articles already described using FIG. 12 will not be repeated.

The image processing apparatus 500 comprises the image obtaining unit 501, a pixel value calculation unit 521, a proportion or difference calculation unit 523, the storage unit 507, a water quality data calculation unit 525, and a water quality distribution image generation unit 527.

The image obtaining unit 501 obtains the image corresponding to the plurality of frames of the same scene in which a water quality examination target including the water surface having the wave is captured. The image obtaining unit 501 obtains the image in which each frame includes a first image and a second image, the first image is an image based on a first wavelength range, and the second image is an image based on a second wavelength range different from the first wavelength range.

The pixel value calculation unit 521 calculates the sum of the pixel value of the first image and the pixel value of the second image for each minute region in each frame based on the first image and the second image in the plurality of frames. That is, the pixel value calculation unit 521 calculates the sum of the first image and the second image in each frame. The pixel value calculation unit 521 is implemented by the image processing unit 24. For example, the pixel values of the first image and the second image are output values of the imaging element 16.

The proportion or difference calculation unit 523 calculates the proportion or the difference between the pixel value of the first image and the pixel value of the second image corresponding to the minute region in a case where the sum of the pixel value of the first image and the pixel value of the second image in the minute region is the minimum in the plurality of frames. The proportion or difference calculation unit 523 is implemented by the image processing unit 24.

The storage unit 507 stores the proportion or the difference calculated by the proportion or difference calculation unit 523.

The water quality data calculation unit 525 calculates water quality data of the water quality examination target based on the proportion or the difference stored in the storage unit 507. The water quality data calculation unit 525 calculates the water quality data using a well-known technology.

For example, in the case of estimating the concentration of chlorophyll a, the water quality data calculation unit 525 performs the estimation using a band ratio method of two wavelengths as follows.

$$\text{Ch1. } a \propto R(\lambda_i)/R(\lambda_j) \quad (4)$$

ChLa: Concentration of chlorophyll a

R(λ) Reflectance of wavelength λ

The used two wavelengths are known to vary depending on a waterbody. For example, 670 nm and 720 nm are used at a shore. Accordingly, the first wavelength range is a wavelength range including 670 nm, and the second wavelength range is a wavelength range including 700 nm. Thus, remote sensing of the concentration of chlorophyll a can be performed by the imaging apparatus 10. For example, the first wavelength range is a wavelength range of greater than or equal to 650 nm and less than or equal to 690 nm, and the second wavelength range is a wavelength range of greater than or equal to 680 nm and less than or equal to 720 nm.

The water quality distribution image generation unit 527 generates the water quality distribution image showing a water quality distribution of the water quality examination target based on the water quality data calculated by the water quality data calculation unit 525. For example, the water quality distribution image generation unit 527 generates a concentration distribution image showing a distribution of the calculated concentration of chlorophyll a as the water quality distribution image. The water quality data calculation unit 525 calculates the concentration of chlorophyll a as the water quality data of the water quality examination target based on the first image and the second image obtained by the image obtaining unit 501.

Figure 18:
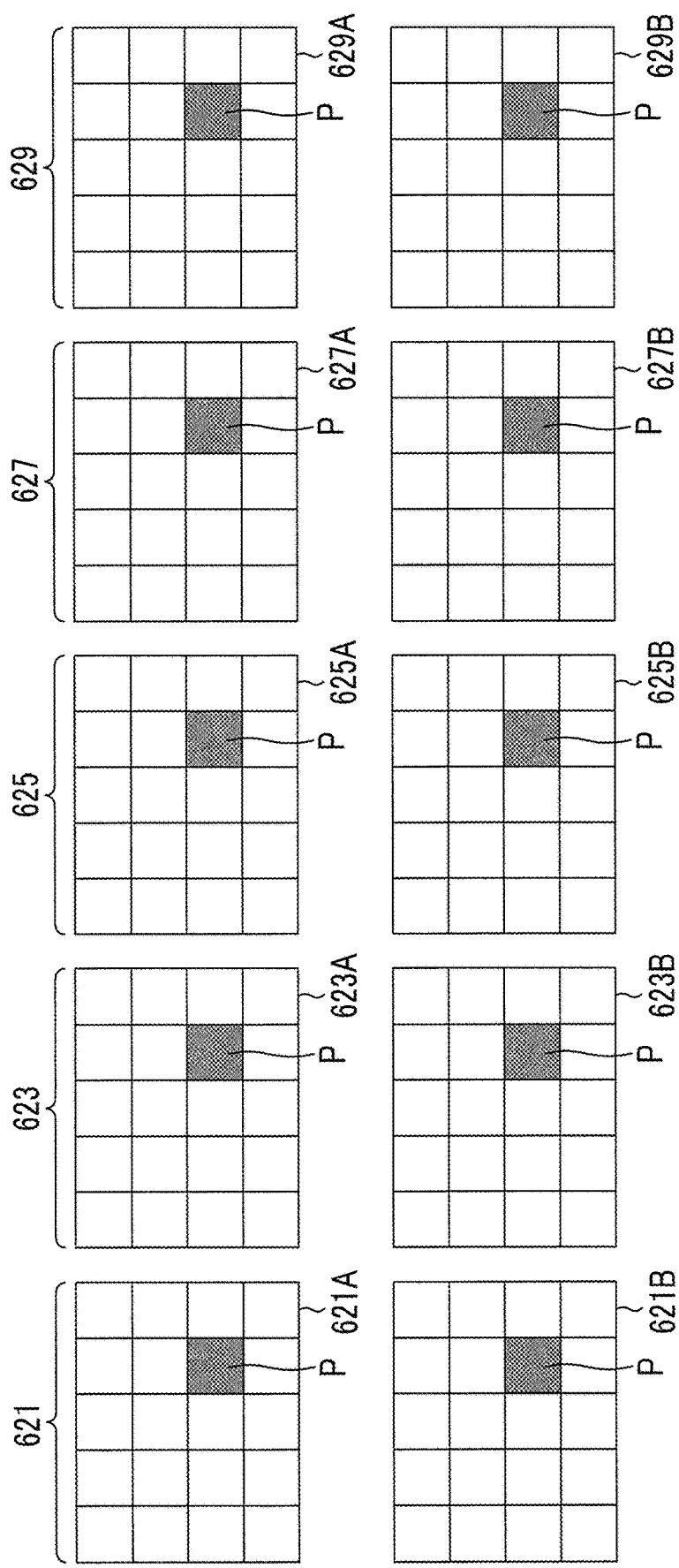
FIG. 18 is a diagram for describing calculation of a proportion or a difference between a pixel of a first image and pixel of a second image.

FIG. 18 is a diagram for describing the calculation of the proportion or difference calculation unit 523 in the same manner as FIG. 13.

The image obtaining unit 501 obtains images corresponding to a first frame 621, a second frame 623, a third frame 625, a fourth frame 627, and a fifth frame 629. Each frame is configured with the first image and the second image.

The pixel value calculation unit 521 calculates the sum of the pixel values of a first image 621A and a second image 621B of the first frame 621. The sum of the pixel values of the first image 621A and the second image 621B is stored in the storage unit 507 as an initial value. Then, the pixel value calculation unit 521 sequentially calculates the sum of the pixel values of a first image 623A and a second image 623B of the second frame 623, the sum of the pixel values of a first image 625A and a second image 625B of the third frame 625, the sum of the pixel values of a first image 627A and a second image 627B of the fourth frame 627, and the sum of the pixel values of a first image 629A and a second image 629B of the fifth frame 629.

The proportion or difference calculation unit 523 calculates the proportion or the difference between the pixel value of the first image and the pixel value of the second image in the minute region in a case where the sum of the pixel value of the first image and the pixel value of the second image calculated by the pixel value calculation unit 521 in the minute region is the minimum.

Figure 19:
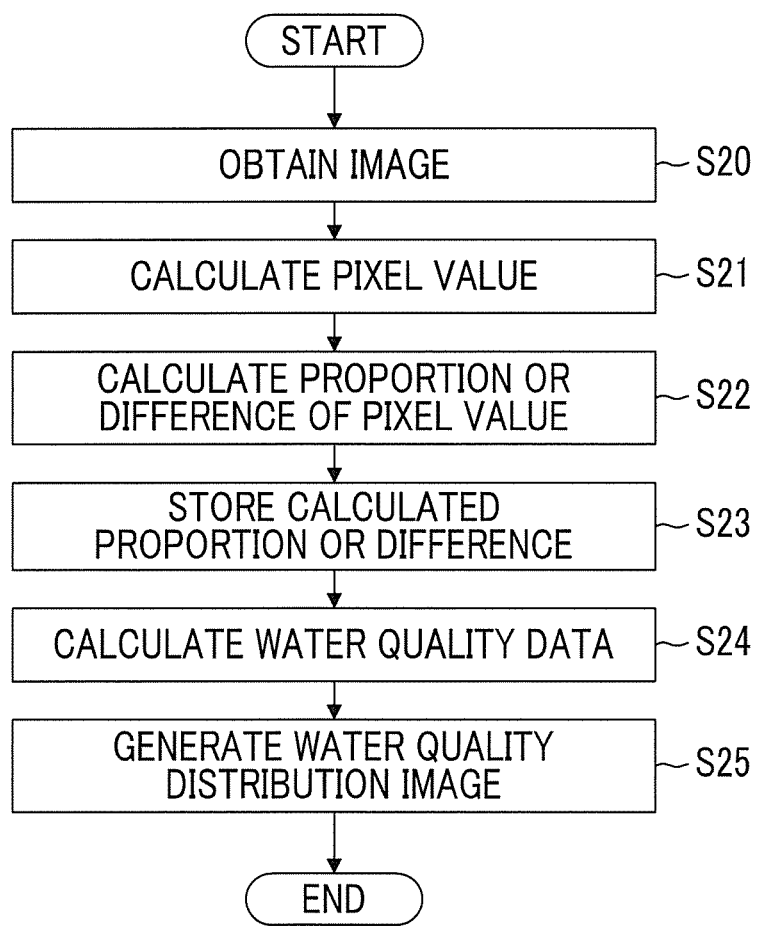
FIG. 19 is a flowchart illustrating an operation of the image processing apparatus.

FIG. 19 is a flowchart illustrating an operation of the image processing apparatus 500.

First, the same scene including the water surface having the wave is imaged by the imaging apparatus 10. The plurality of frame images in which the same scene including the water surface having the wave is captured are obtained by the image obtaining unit 501 (image obtaining step: step S20).

Next, the sum of the pixel value of the first image and the pixel value of the second image of each frame in the minute region is calculated by the pixel value calculation unit 521 (pixel value calculation step: step S21). Then, the proportion or the difference corresponding to the minute region in a case where the pixel value of the minute region is the minimum in the plurality of frame images is calculated by the proportion or difference calculation unit 523 (proportion or difference calculation step: step S22). Then, the calculated proportion or difference is stored in the storage unit 507 (storage step: step S23). Then, the water quality data is calculated by the water quality data calculation unit 525 based on the proportion or the difference stored in the storage unit 507 (water quality data calculation step: step S24). The water quality distribution image is generated by the water quality distribution image generation unit 527 (water quality distribution image generation step: step S25).

Figure 20:
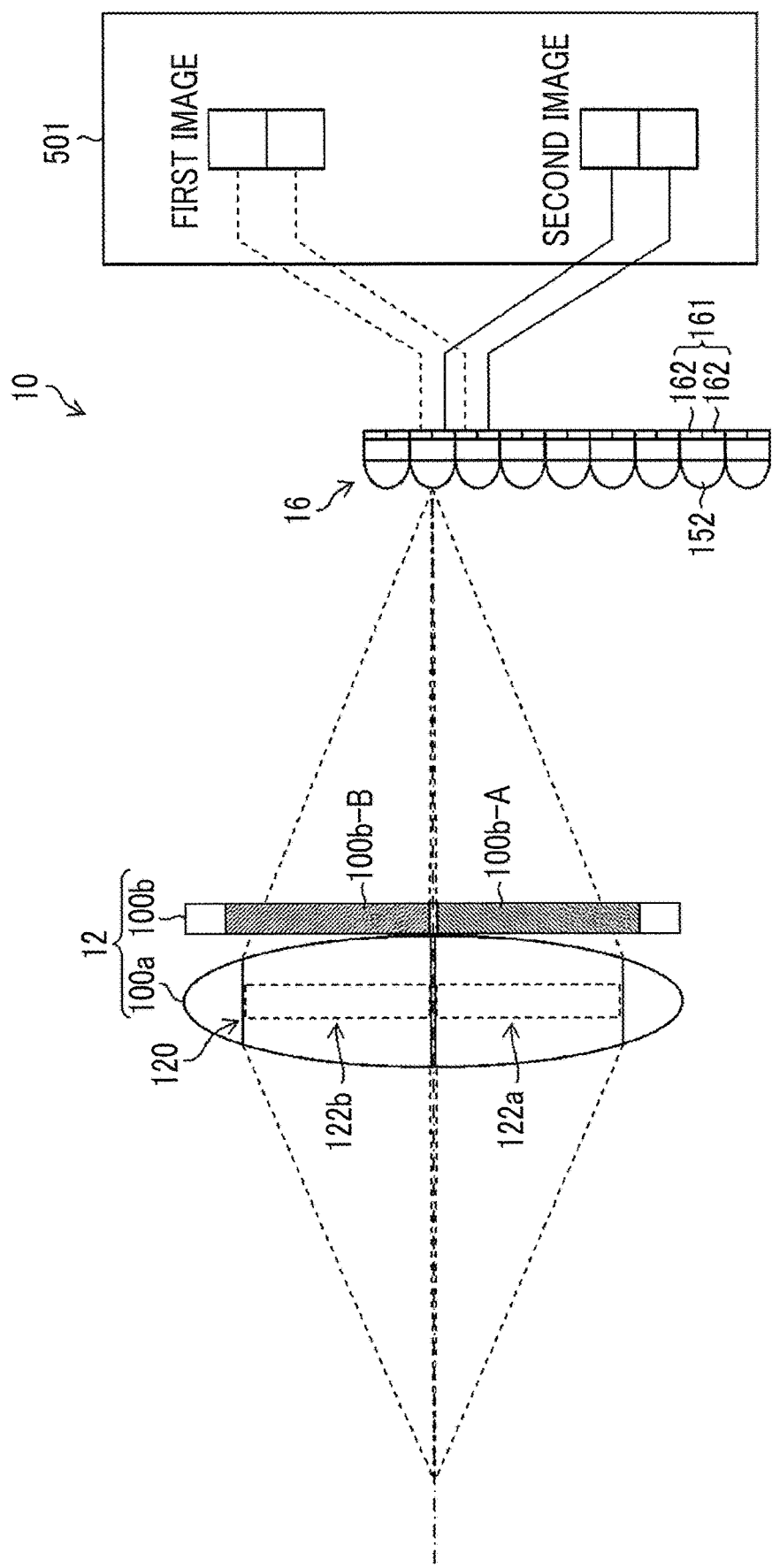
FIG. 20 is a diagram schematically illustrating one example of a block configuration of the imaging apparatus.

FIG. 20 is a diagram schematically illustrating one example of a block configuration of a main part of the imaging apparatus 10 used in the second embodiment.

The imaging apparatus 10 comprises the imaging lens 12, the imaging element 16, and the image obtaining unit 501.

The imaging lens 12 is a single lens system for imaging and has different transmission wavelength characteristics for each range in which the incidence ray passes. The imaging lens 12 comprises one or more lenses (image forming lenses) 100a and a wavelength separation filter 100b for setting a different transmission wavelength range for each incidence region of the image forming lens.

The wavelength separation filter 100b includes a first optical filter allowing transmission of light having the first wavelength range and a second optical filter allowing transmission of light having the second wavelength range different from the first wavelength range. That is, the wavelength separation filter 100b includes an A filter 100b-A (first optical filter) allowing transmission of light having the first wavelength range and a B filter 100b-B (second optical filter) allowing transmission of light having the second wavelength range.

The A filter 100b-A and the B filter 100b-B are arranged in correspondence with a pupil region 122a (first region) and a pupil region 122b (second region) of an exit pupil 120 of the lens 100a, respectively. Accordingly, of subject light passing through the imaging lens 12, light that passes through the pupil region 122a of the exit pupil 120 of the imaging lens 12 is light having the first wavelength range, and light that passes through the pupil region 122b is light having the second wavelength range.

The wavelength separation filter 100b of the present embodiment is arranged in a subsequent stage of the lens 100a on the optical path of the subject light in the vicinity of a pupil surface of the lens 100a. Alternatively, the wavelength separation filter 100b may be arranged at an optically equivalent position. The imaging lens 12 may have an optical path that provides different transmission wavelength characteristics in the whole lens system. The difference in transmission wavelength characteristics may not be provided by a specific optical surface of a specific optical filter. The wavelength separation filter 100b may also have a lens effect.

The subject light passing through the imaging lens 12 is incident on the imaging element 16. The imaging element 16 separately receives light passing through the pupil region 122a of the exit pupil 120 of the imaging lens 12 and light passing through the pupil region 122b. The imaging element 16 supplies a signal based on the separately received light to the image obtaining unit 501 as an image signal.

The image obtaining unit 501 obtains the first image of the light reception through the first optical filter and the second image of the light reception through the second optical filter. That is, the image obtaining unit 501 obtains two images having different wavelengths from the image signal.

The imaging element (directional sensor) 16 includes a plurality of pixels configured with two-dimensionally arranged photoelectric conversion elements. In the imaging element 16, luminous fluxes that are incident through the first optical filter and the second optical filter are selectively received by pupil separation.

The imaging element 16 includes a plurality of microlenses 152. The microlenses 152 are arranged in a direction perpendicular to the optical axis in accordance with a predetermined rule. In each microlens 152, a corresponding light-receiving element group 161 is arranged as a deflection optical element. The light-receiving element group 161 is configured with a plurality of light-receiving elements 162.

Metal oxide semiconductor (MOS) or CMOS type imaging elements are used as the plurality of light-receiving elements 162. Besides, solid-state imaging elements such as CCD type imaging elements may be used as the plurality of light-receiving elements 162.

Figure 21A:
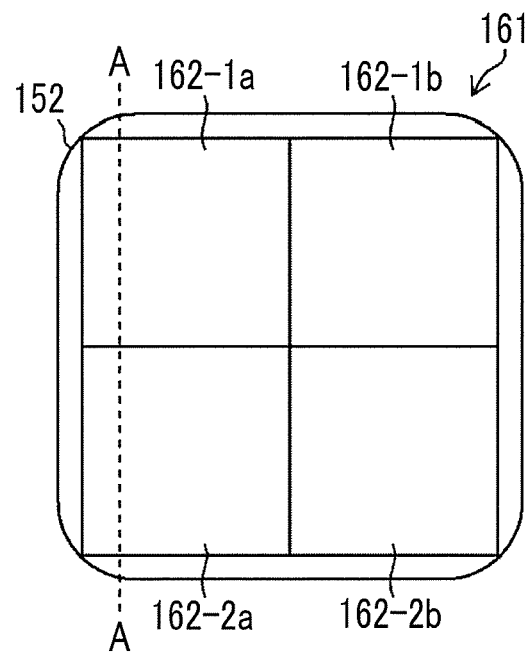
FIGS. 21A and 21B are schematic diagrams of a light-receiving element group seen from an optical axis direction.

FIG. 21A is a schematic diagram of the microlens 152 and the corresponding light-receiving element group 161 seen from the optical axis direction. As illustrated in FIG. 21A, in the present embodiment, the light-receiving element group 161 in which four light-receiving elements 162-1a, 162-1b, 162-2a, and 162-2b are arranged in two rows and two columns is comprised in correspondence with one microlens 152.

Figure 21B:
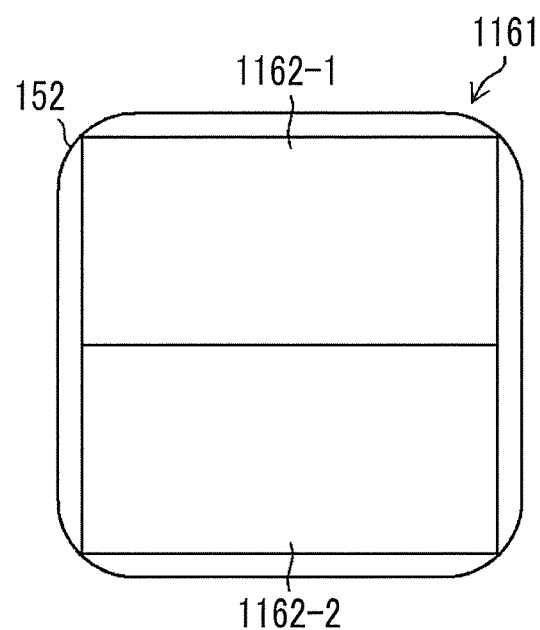

The light-receiving element group corresponding to the microlens may be such that a light-receiving element group 1161 in which light-receiving elements 1162-1 and 1162-2 having a rectangular shape corresponds to the microlens 152 as illustrated in FIG. 21B.

Figure 22:
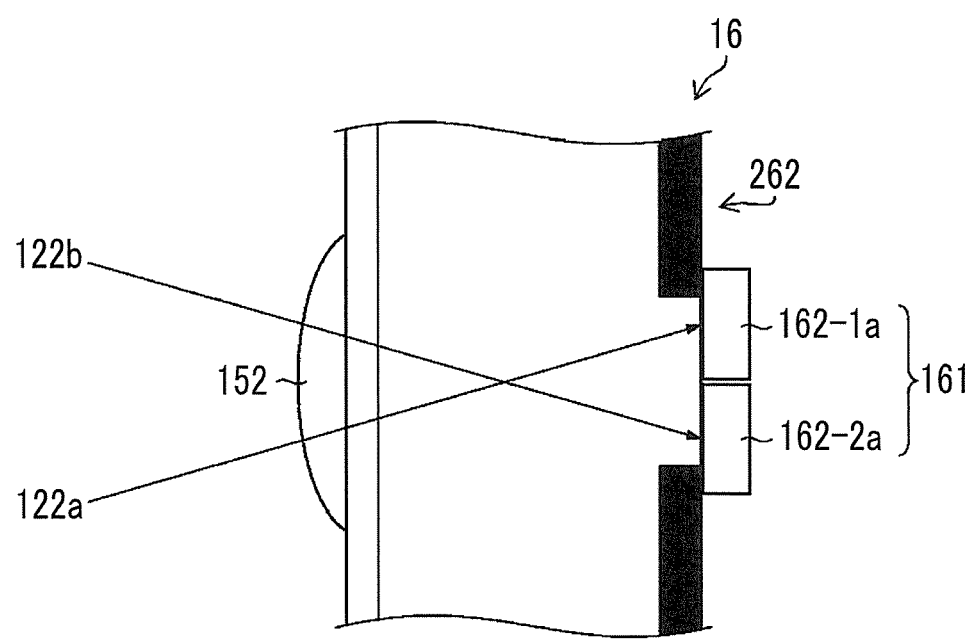
FIG. 22 is a cross-sectional view along broken line A-A in FIG. 21A.

FIG. 22 is a cross-sectional view along broken line A-A in FIG. 21A. As illustrated in FIG. 22, light passing through the pupil region 122a of the exit pupil 120 of the imaging lens 12 is received in the light-receiving element 162-1a by the microlens 152. While illustration is not provided, light passing through the pupil region 122b is also received in the light-receiving element 162-1b by the microlens 152.

Light passing through the pupil region 122b is received in the light-receiving elements 162-2a and 162-2b by the microlens 152. A reference sign 262 illustrated in FIG. 22 denotes a light blocking unit that is disposed for preventing interference between adjacent pixels.

As described above, light passing through the pupil region 122a is light having the first wavelength range, and light passing through the pupil region 122b is light having the second wavelength range. Accordingly, the light-receiving elements 162-1a and 162-1b receive light having the first wavelength range, and the light-receiving elements 162-2a and 162-2b receive light having the second wavelength range.

By forming the image forming relationship between the pupil of the imaging lens 12 and the plurality of light-receiving elements 162 using the microlens, light received by each light-receiving element 162 is restricted to light passing through the predetermined pupil region 122 in the exit pupil 120 of the imaging lens 12.

Each light-receiving element 162 of the light-receiving element group 161 outputs an imaging signal having a strength corresponding to the intensity of received light to the image obtaining unit 501. The image obtaining unit 501 generates and obtains an image of the subject from the imaging signals of the plurality of light-receiving elements 162. Specifically, the image obtaining unit 501 generates image signals indicating images having different wavelength ranges from the imaging signals supplied from the light-receiving element group 161.

In the present example, the image obtaining unit 501 generates an image having the first wavelength range (first image) from the imaging signals of the light-receiving elements 162-1a and 162-1b that receive light passing through the pupil region 122a. In addition, the image obtaining unit 501 generates an image having the second wavelength range (second image) from the imaging signals of the light-receiving elements 162-2a and 162-2b that receive light passing through the pupil region 122b.

In the present embodiment, an example in which light passing through two regions of the exit pupil is caused to be incident on two light-receiving elements in the vertical direction by the microlens is illustrated. The two regions of the exit pupil to which the microlens is directed correspond to regions of an imaging optical system having different transmission wavelengths. Thus, images having two different wavelength ranges can be independently obtained at the same time in parallel. Accordingly, the two images obtained by the imaging apparatus 10 are images having the same optical axis. In this case, the plurality of microlenses 152 (microlens array) function as a pupil separation unit.

Figure 23:
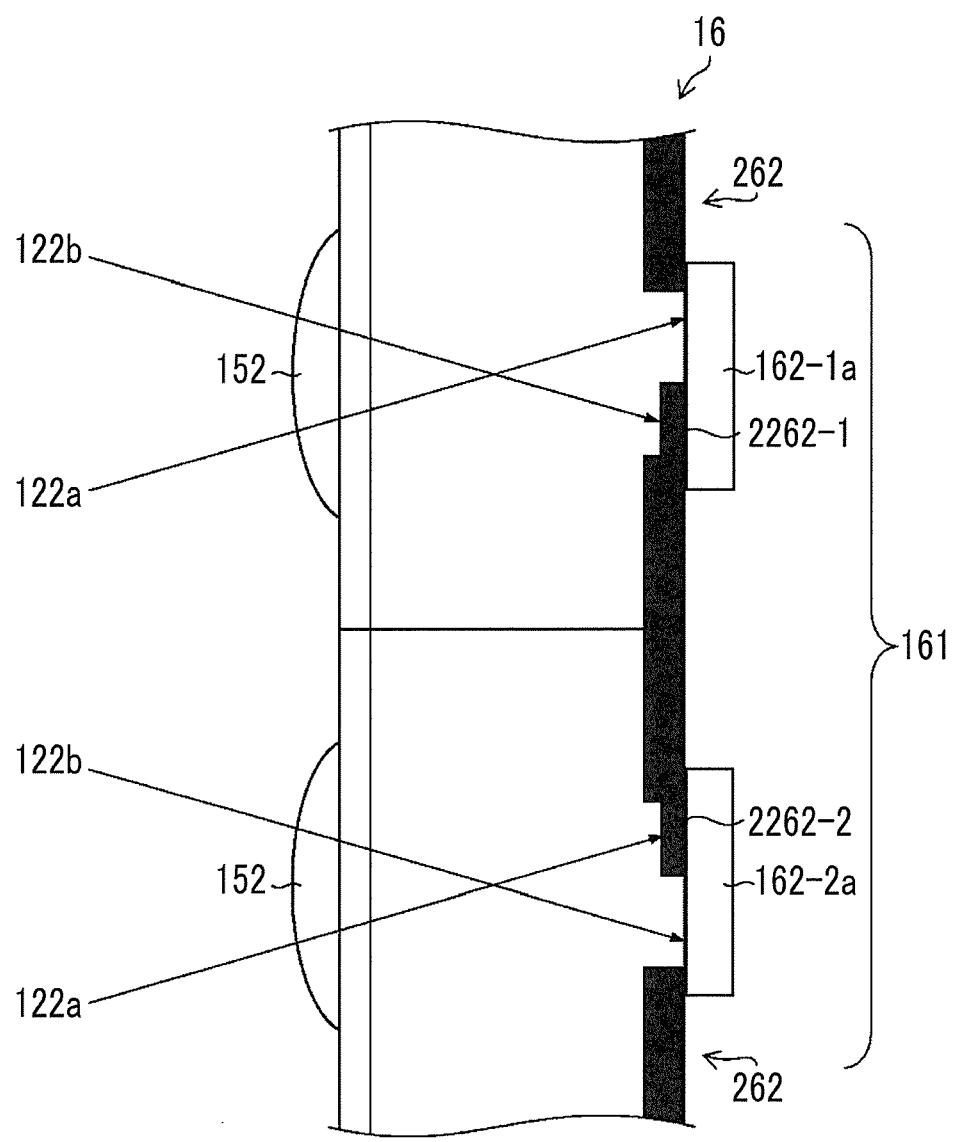
FIG. 23 is a cross-sectional view along broken line A-A in FIG. 21A.

In addition, unlike the aspect in which the plurality of light-receiving elements 162 are associated with the microlens 152, a light blocking mask can function as the pupil separation unit by associating one light-receiving element 162 with the microlens 152. FIG. 23 is a diagram for describing a case where the light blocking mask functions as the pupil separation unit in the same cross-sectional view as FIG. 22. In this case, one light-receiving element 162 is comprised for one microlens 152. Incidence of light on a part of each light-receiving element 162 is blocked by light blocking masks 2262-1 and 2262-2. Accordingly, light passing through the pupil region 122a of the exit pupil 120 of the imaging lens 12 is received in the light-receiving element 162-1a by the microlens 152. Light passing through the pupil region 122b is received in the light-receiving elements 162-2a and 162-2b by the microlens 152.

Third Embodiment

Next, the third embodiment of the present invention will be described.

Figure 24:
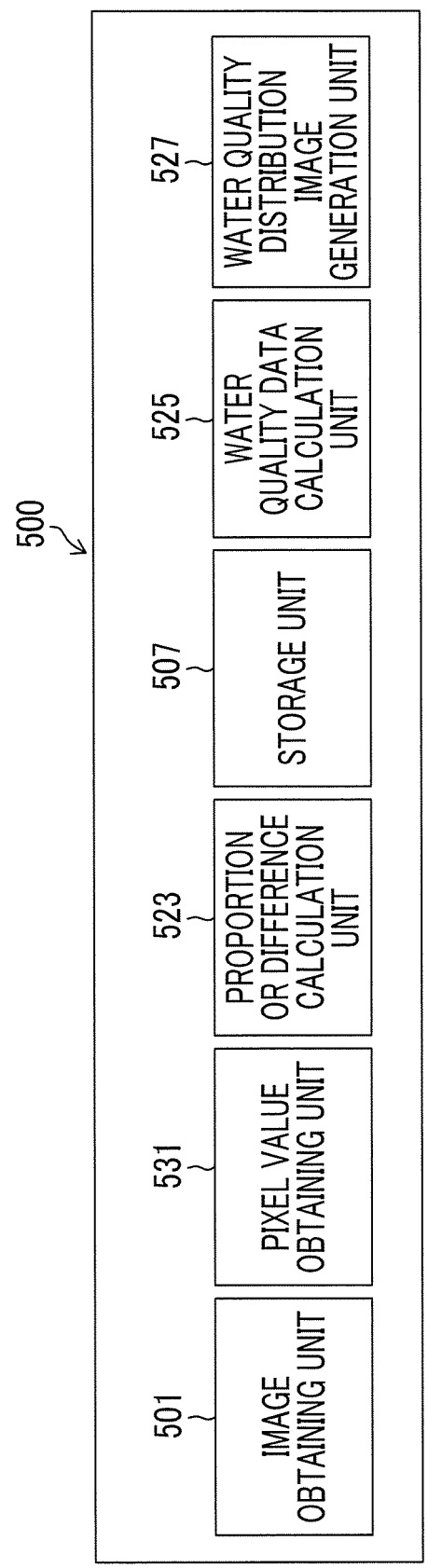
FIG. 24 is a diagram illustrating a function block diagram of the image processing apparatus.

FIG. 24 is a diagram illustrating a function block diagram of the image processing apparatus 500 according to the embodiment of the present invention. Descriptions of articles already described using FIG. 17 will not be repeated.

The image processing apparatus 500 comprises the image obtaining unit 501, a pixel value obtaining unit 531, the proportion or difference calculation unit 523, the storage unit 507, the water quality data calculation unit 525, and the water quality distribution image generation unit 527.

The image obtaining unit 501 obtains the image corresponding to the plurality of frames of the same scene in which a water quality examination target including the water surface having the wave is captured. Each frame obtained by the image obtaining unit 501 includes the first image, the second image, and the third image. The first image is an image based on the first wavelength range. The second image is an image based on the second wavelength range different from the first wavelength range. The third image is an image based on the third wavelength range that includes the first wavelength range and the second wavelength range. For example, the third wavelength range is a wavelength range of visible light.

The pixel value obtaining unit 531 obtains the pixel value corresponding to the minute region constituting each third image based on the third images of the plurality of frames. The pixel value obtaining unit 531 is implemented by the image processing unit 24. For example, the pixel value of the third image is the output value of the imaging element 16.

The proportion or difference calculation unit 523 calculates the proportion or the difference between the pixel value of the first image and the pixel value of the second image corresponding to the minute region in a case where the pixel value of the minute region is the minimum in the plurality of frames.

Figure 25:
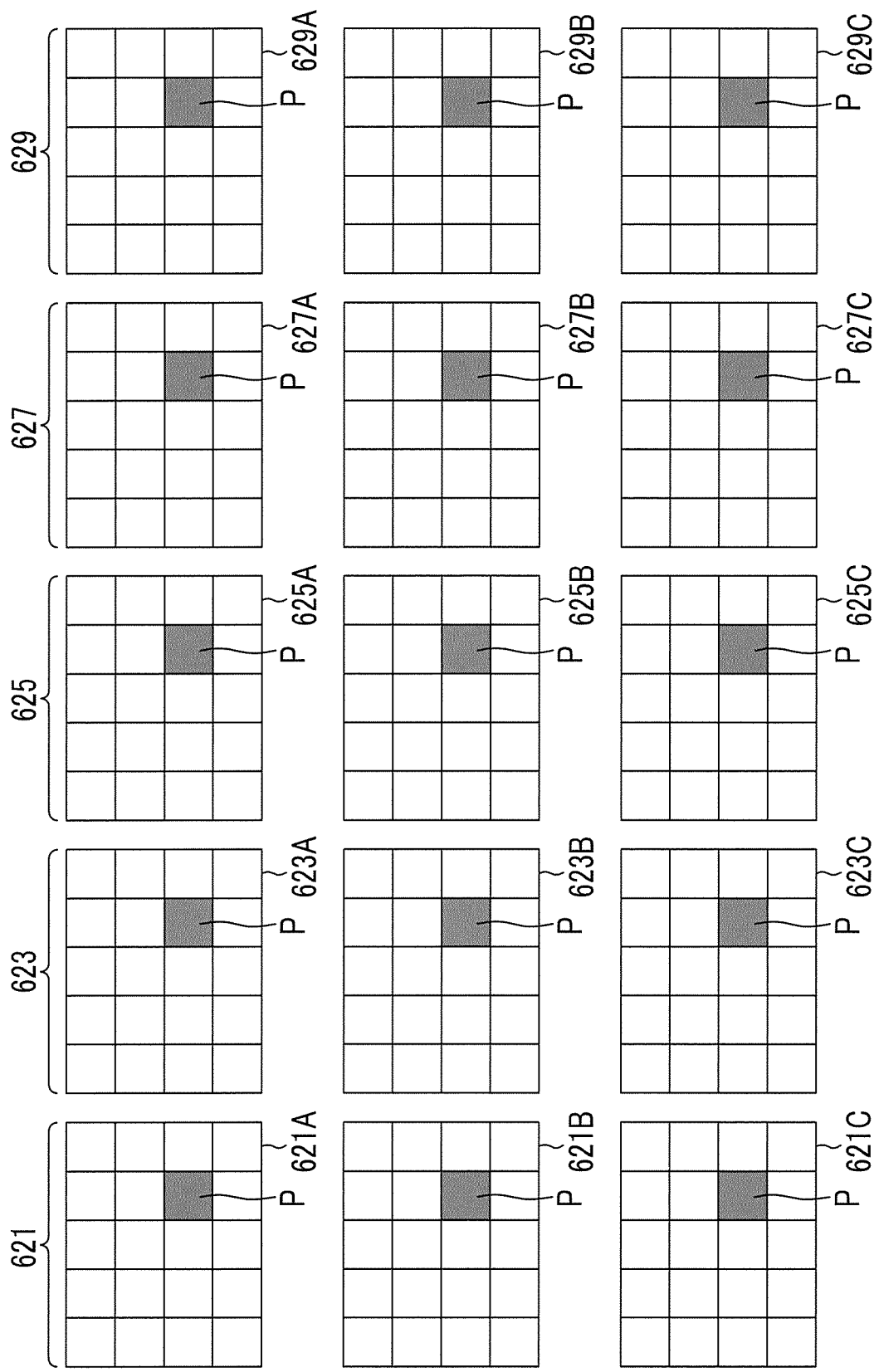
FIG. 25 is a diagram for describing calculation of a proportion or difference calculation unit.

FIG. 25 is a diagram for describing the calculation of the proportion or difference calculation unit 523 in the same manner as FIG. 13.

The image obtaining unit 501 obtains images corresponding to the first frame 621, the second frame 623, the third frame 625, the fourth frame 627, and the fifth frame 629. Each frame is configured with the first image, the second image, and the third image.

The pixel value obtaining unit 531 obtains the pixel value of a third image 621C of the first frame 621. The pixel value of the third image 621C of the first frame 621 is set as the initial value. Then, the pixel value of a third image 623C of the second frame 623, the pixel value of a third image 625C of the third frame 625, the pixel value of a third image 627C of the fourth frame 627, and the pixel value of a third image 629C of the fifth frame 629 are sequentially obtained.

The proportion or difference calculation unit 523 calculates the proportion or the difference between the pixel value of the first image and the pixel value of the second image in the minute region in a case where the pixel value of the third image obtained by the pixel value obtaining unit 531 in the minute region is the minimum. For example, in a case where the third wavelength range is the wavelength range of visible light, the pixel value of the third image is output with high sensitivity. Thus, the proportion or the difference is calculated at a more accurate timing.

Figure 26:
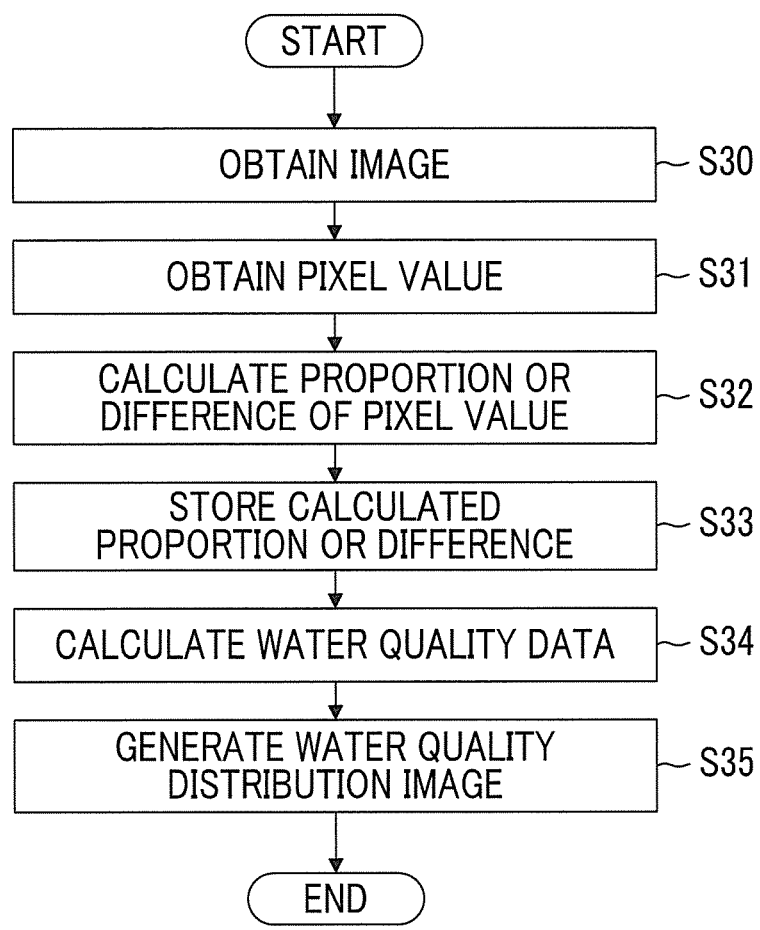
FIG. 26 is a flowchart illustrating an operation of the image processing apparatus.

FIG. 26 is a flowchart illustrating an operation of the image processing apparatus 500.

First, the same scene including the water surface having the wave is imaged by the imaging apparatus 10. The plurality of frame images in which the same scene including the water surface having the wave is captured are obtained by the image obtaining unit 501 (image obtaining step: step S30).

Next, the pixel value of the third image in the minute region is obtained by the pixel value obtaining unit 531 (pixel value obtaining step: step S31). Then, the proportion or the difference corresponding to the minute region in a case where the pixel value of the minute region is the minimum in the plurality of frame images is calculated by the proportion or difference calculation unit 523 (proportion or difference calculation step: step S32). Then, the calculated proportion or difference is stored in the storage unit 507 (storage step: step S33). The water quality data is calculated by the water quality data calculation unit 525 based on the proportion or the difference stored in the storage unit 507 (water quality data calculation step: step S34). The water quality distribution image is generated by the water quality distribution image generation unit 527 (water quality distribution image generation step: step S35).

Figure 27:
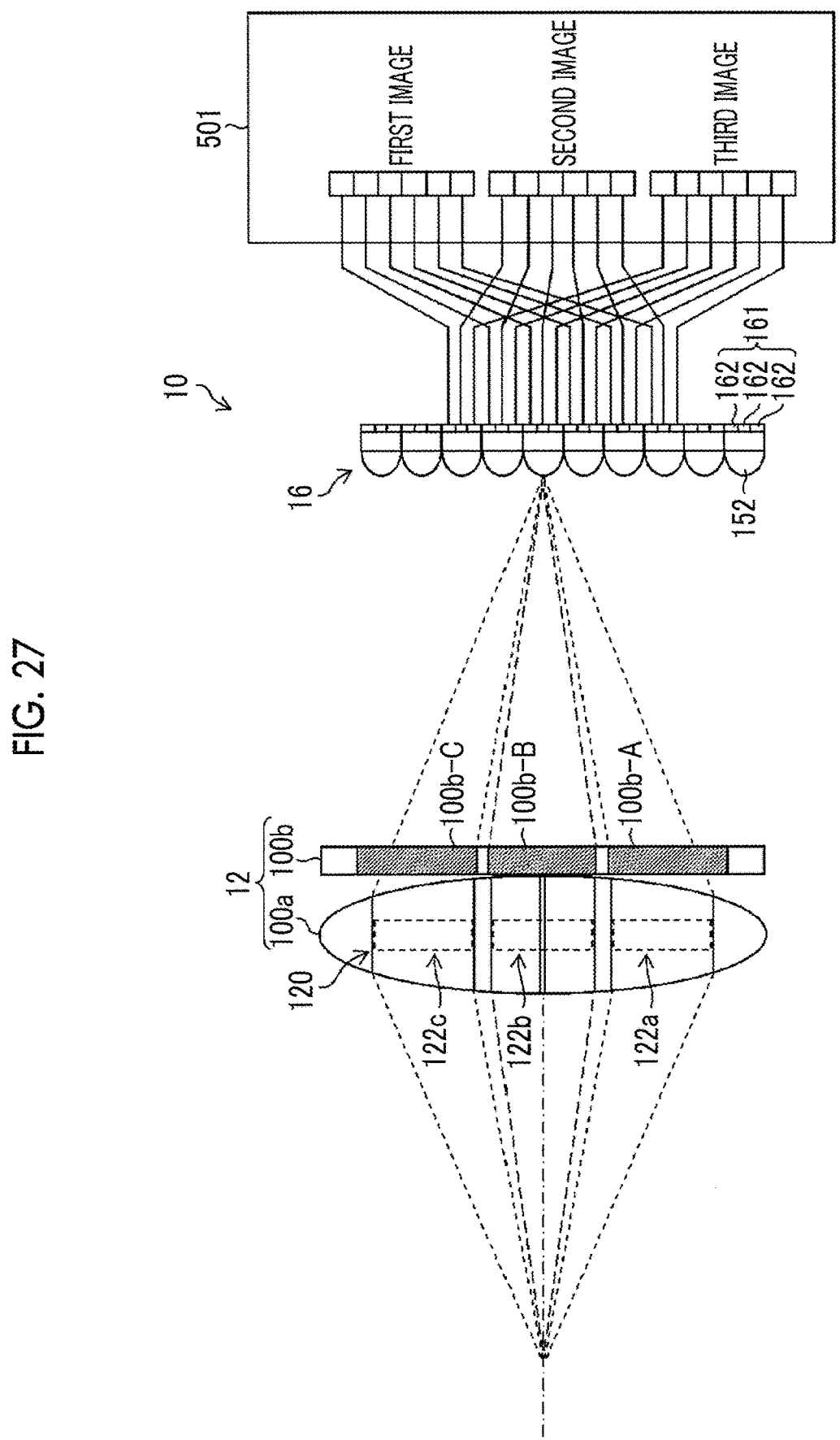
FIG. 27 is a diagram schematically illustrating one example of a block configuration of the imaging apparatus.

FIG. 27 is a diagram schematically illustrating one example of a block configuration of a main part of the imaging apparatus 10 used in the third embodiment.

FIG. 27 schematically illustrates one example of a block configuration of the imaging apparatus 10. The imaging apparatus 10 comprises the imaging lens 12, the imaging element 16, and the image obtaining unit 501.

The imaging lens 12 is a single lens system for imaging and has different transmission wavelength characteristics for each range in which the incidence ray passes. The imaging lens 12 comprises one or more lenses 100a and the wavelength separation filter 100b for setting a different transmission wavelength range for each incidence region of the image forming lens.

The wavelength separation filter 100b has three wavelength ranges. That is, the wavelength separation filter 100b includes a C filter 100b-C allowing transmission of light having the third wavelength range, the B filter 100b-B allowing transmission of light having the second wavelength range, and the A filter 100b-A allowing transmission of light having the first wavelength range.

The A filter 100b-A, the B filter 100b-B, and the C filter 100b-C are arranged in correspondence with the pupil region 122a, the pupil region 122b, and a pupil region 122c of the exit pupil 120 of the lens 100a, respectively. Accordingly, of subject light passing through the imaging lens 12, light that passes through the pupil region 122a of the exit pupil 120 of the imaging lens 12 is light having the first wavelength range. Light that passes through the pupil region 122b is light having the second wavelength range. Light that passes through the pupil region 122c is light having the third wavelength range.

The wavelength separation filter 100b is arranged in a subsequent stage of the lens 100a on the optical path of the subject light in the vicinity of a pupil surface of the lens 100a. Alternatively, the wavelength separation filter 100b may be arranged at an optically equivalent position. The imaging lens 12 may have an optical path that provides different transmission wavelength characteristics in the whole lens system. The difference in transmission wavelength characteristics may not be provided by a specific optical surface of a specific filter. The wavelength separation filter 100b may also have a lens effect.

The subject light passing through the imaging lens 12 is incident on the imaging element 16. The imaging element 16 separately receives light passing through the pupil region 122a of the exit pupil 120 of the imaging lens 12, light passing through the pupil region 122b, and light passing through the pupil region 122c. The imaging element 16 supplies a signal based on the separately received light to the image obtaining unit 501 as an image signal. The image obtaining unit 501 generates images having different colors from the image signal.

The imaging element 16 includes the plurality of microlenses 152. The microlenses 152 are arranged in a direction perpendicular to the optical axis in accordance with a predetermined rule. In each microlens 152, the corresponding light-receiving element group 161 is arranged as the deflection optical element. The light-receiving element group 161 is configured with the plurality of light-receiving elements 162.

The plurality of light-receiving elements 162 may form MOS type imaging elements. Besides MOS type imaging elements, the plurality of light-receiving elements 162 may form solid-state imaging elements such as CCD type imaging elements.

Figure 28A:
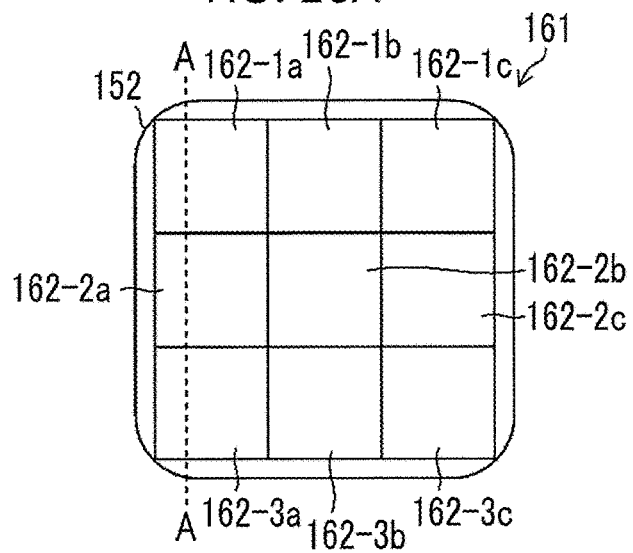
FIGS. 28A to 28C are schematic diagrams of the light-receiving element group seen from the optical axis direction.

FIG. 28A is a schematic diagram of the microlens 152 and the corresponding light-receiving element group 161 seen from the optical axis direction. As illustrated in FIG. 28A, in the present embodiment, the light-receiving element group 161 in which nine light-receiving elements 162-1$a$, 162-1$b$, 162-1$c$, 162-2$a$, 162-2$b$, 162-2$c$, 162-3$a$, 162-3$b$, and 162-3$c$ are arranged in three rows and three columns is comprised in correspondence with one microlens 152.

Figure 28B:
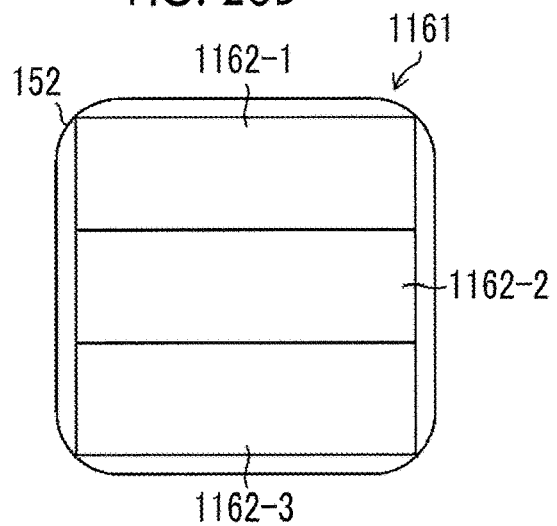
Figure 28C:
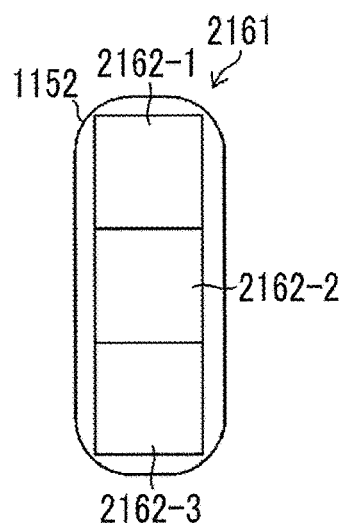

The light-receiving element group corresponding to the microlens may be such that the light-receiving element group 1161 in which light-receiving elements 1162-1, 1162-2, and 1162-3 having a rectangular shape are arranged corresponds to the microlens 152 as illustrated in FIG. 28B, or a light-receiving element group 2161 in which light-receiving elements 2162-1, 2162-2, and 2162-3 are arranged corresponds to a vertically long microlens as illustrated in FIG. 28C.

Figure 29:
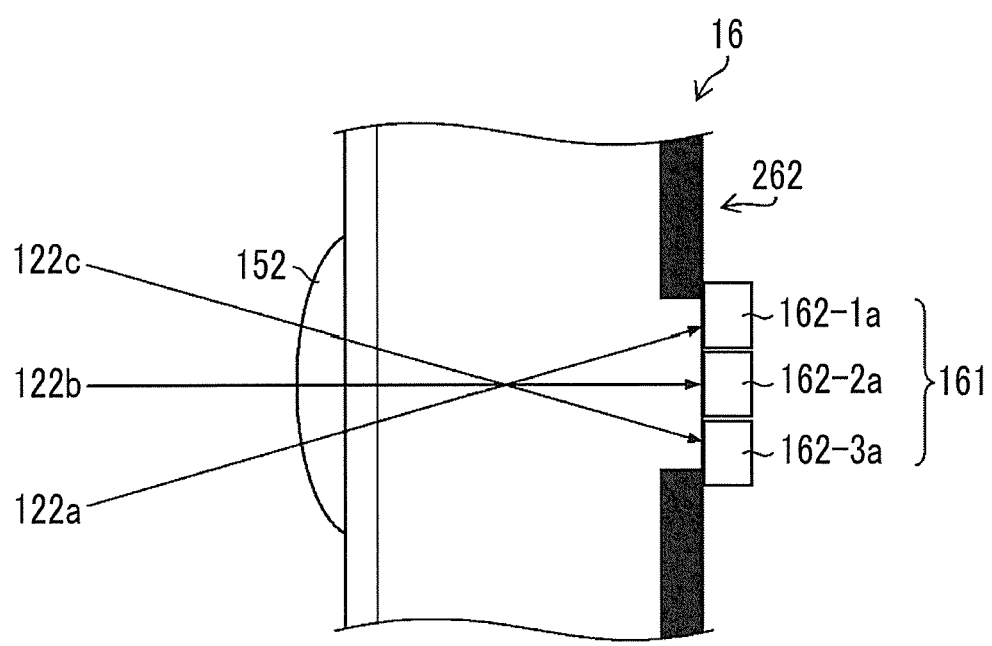
FIG. 29 is a cross-sectional view along broken line A-A in FIG. 28A.

FIG. 29 is a cross-sectional view along broken line A-A in FIG. 28A. As illustrated in FIG. 29, light passing through the pupil region 122$a$ of the exit pupil 120 of the imaging lens 12 is received in a light-receiving element 162-1$a$ by the microlens 152. Light passing through the pupil region 122$b$ is received in a light-receiving element 162-2$a$ by the microlens 152. Light passing through the pupil region 122$c$ is received in a light-receiving element 162-3$a$ by the microlens 152.

The reference sign 262 illustrated in FIG. 29 denotes the light blocking unit that is disposed for preventing interference between adjacent pixels.

As described above, light passing through the pupil region 122$a$ is light having the first wavelength range. Light passing through the pupil region 122$b$ is light having the second wavelength range. Light passing through the pupil region 122$c$ is light having the third wavelength range. Accordingly, the light-receiving elements 162-1$a$, 162-1$b$, and 162-1$c$ receive light having the first wavelength range. The light-receiving elements 162-2$a$, 162-2$b$, and 162-2$c$ receive light having the second wavelength range. The light-receiving elements 162-3$a$, 162-3$b$, and 162-3$c$ receive light having the third wavelength range.

By forming the image forming relationship between the pupil of the imaging lens 12 and the plurality of light-receiving elements 162 using the microlens, light received by each light-receiving element 162 is restricted to light passing through the predetermined pupil region 122 in the exit pupil 120 of the imaging lens 12.

Each light-receiving element 162 of the light-receiving element group 161 outputs an imaging signal having a strength corresponding to the intensity of received light to the image obtaining unit 501. The image obtaining unit 501 generates an image of the subject from the imaging signals of the plurality of light-receiving elements 162. Specifically, the image obtaining unit 501 generates image signals indicating images having different colors from the imaging signals supplied from the light-receiving element group 161.

In the present example, the image obtaining unit 501 generates an image having the first wavelength range (first image) from the imaging signals of the light-receiving elements 162-1$a$, 162-1$b$, and 162-1$c$ that receive light passing through the pupil region 122$a$. In addition, the image obtaining unit 501 generates an image having the second wavelength range (second image) from the imaging signals of the light-receiving elements 162-2$a$, 162-2$b$, and 162-2$c$ that receive light passing through the pupil region 122$b$. Similarly, the image obtaining unit 501 generates an image having the third wavelength range (third image) from the imaging signals of the light-receiving elements 162-3$a$, 162-3$b$, and 162-3$c$ that receive light passing through the pupil region 122$c$.

In the present embodiment, an example in which light passing through three regions of the exit pupil is caused to be incident on three light-receiving elements in the vertical direction by the microlens is illustrated. The three regions of the exit pupil to which the microlens is directed correspond to regions of an imaging optical system having different transmission wavelengths. Thus, images having three different wavelength ranges can be independently obtained at the same time in parallel.

Figure 30:
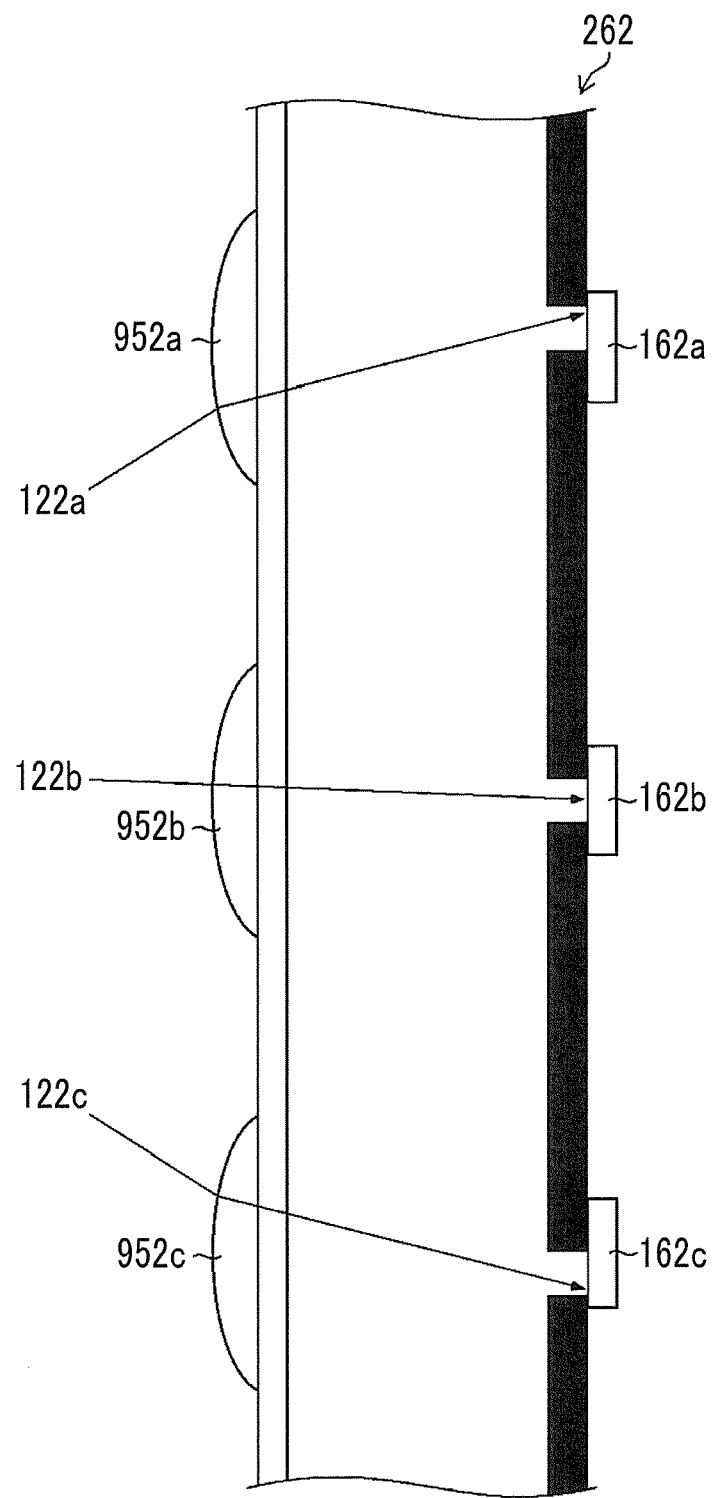
FIG. 30 is a cross-sectional view along broken line A-A in FIG. 28A.

FIG. 30 is a diagram schematically illustrating one example of a light-receiving unit. The imaging element 16 of the present embodiment comprises one light-receiving element in correspondence with one microlens. In the example in FIG. 30, the light-receiving element 162$a$, the light-receiving element 162$b$, and the light-receiving element 162$c$ are arranged in correspondence with a microlens 952$a$, a microlens 952$b$, and a microlens 952$c$, respectively.

Light that passes through approximately the whole surface of the exit pupil 120 is incident on each microlens 952. The microlens 952 has an optical power having a magnitude that causes light passing through a partial region of the exit pupil 120 to be received in each light-receiving element 162. Accordingly, the magnitude of a luminous flux that is receivable by the light-receiving element 162 is restricted to the magnitude of a luminous flux passing through a partial range of the exit pupil 120.

In the imaging element 16 in the present embodiment, the optical axis of the microlens 952 is disposed in a deviating manner with respect to the center position of the light-receiving element 162 in a plane perpendicular to the optical axis of the imaging lens 12. The center position of the light-receiving element 162 is the center position of a region through which light that is received by the light-receiving element 162 and can be used in photoelectric conversion passes. The center position of the light-receiving element 162 may be the center of a light-receiving opening that is formed in the light blocking unit 262 and is positioned in the vicinity of the light-receiving element 162.

The deviation amount of each microlens 952 is designed such that light passing through the predetermined pupil region 122 is received in the corresponding light-receiving element 162. Based on the optical power and the deviation of the microlens 952, the luminous flux receivable by the light-receiving element 162 is restricted to a luminous flux that passes through a partial region of the exit pupil 120.

In the present embodiment, the microlens 952$a$ restricts light receivable by the light-receiving element 162$a$ through the light-receiving opening to light that passes through the pupil region 122$a$. Similarly, the microlenses 952$b$ and 952$c$ restrict light receivable by the corresponding light-receiving elements 162$b$ and 162$c$ through the light-receiving opening to light that passes through the pupil regions 122$b$ and 122$c$, respectively.

Accordingly, the light-receiving element 162$a$ receives light having the first wavelength range. The light-receiving element 162$b$ receives light having the second wavelength range. The light-receiving element 162c receives light having the third wavelength range.

The optical axes of the plurality of microlenses 952 are disposed in a deviating manner with respect to the light-receiving opening of the light-receiving elements 162 such that the subject light passing through the corresponding predetermined pupil region 122 is received in the corresponding light-receiving element 162. Consequently, each light-receiving element 162 receives light having different transmission wavelength ranges. The image obtaining unit 501 can obtain the first image, the second image, and the third image from the imaging signal of each light-receiving element 162.

While examples of the present invention are described thus far, the present invention is not limited to the embodiments described above. Various modifications can be made without departing from the spirit of the present invention.

EXPLANATION OF REFERENCES

1: strobe
2: shutter button
3: power supply/mode switch
4: mode dial
5: zoom button
6: cross button
7: MENU/OK button
8: playback button
9: BACK button
10: imaging apparatus
11: tripod
12: imaging lens
13: polarization filter
14: stop
15: mechanical shutter
16: imaging element
22: image input controller
24: image processing unit
26: compression/expansion processing unit
28: video encoder
30: liquid crystal monitor
38: operation unit
40: CPU
47: ROM
48: memory
50: VRAM
52: media controller
54: memory card
500: image processing apparatus
501: image obtaining unit
503: brightness value calculation unit
505: pixel value extraction unit
507: storage unit
509: composite image generation unit
521: pixel value calculation unit
523: proportion or difference calculation unit
525: water quality data calculation unit
527: water quality distribution image generation unit
531: pixel value obtaining unit
step S10-step S16: step of image processing method
step S20-step S25: step of image processing method
step S30-step S35: step of image processing method

What is claimed is:
1. An image processing apparatus comprising:
a processor configured to:
obtain a plurality of frame images of a same scene including a water surface having a wave, each frame image including a plurality of minute regions;
wherein each minute region of a frame image has a corresponding minute region in each of the other frame images respectively, wherein the corresponding minute regions of the frame images are defined as a set, and a total number of sets is equal to the number of minute regions in one frame image,
calculate a brightness value for each of the minute regions of each frame image respectively to obtain a plurality of brightness values, wherein a number of the plurality of frame images is greater than 2, and the minute region is a region of one pixel in each frame image;
for each set of corresponding minute regions, extract a pixel value corresponding to the minute region of a frame image in which the brightness value of the minute region is a minimum as compared to the brightness values of the minute region of other frame images in the plurality of frame images;
store the pixel value of each set extracted by the processor to obtain a plurality of pixel values; and
generate a composite image corresponding to the scene based on the plurality of pixel values stored in the processor.

2. The image processing apparatus according to claim 1, wherein the wave is an artificially generated wave.

3. An imaging apparatus comprising:
the image processing apparatus according to claim 1.

4. The imaging apparatus according to claim 3,
wherein the same scene including the water surface having the wave is imaged by fixing the imaging apparatus at a fixed point.

5. The imaging apparatus according to claim 3, further comprising:
a polarization filter through which a luminous flux of the same scene including the water surface having the wave passes.

6. An image processing method comprising:
an image obtaining step of obtaining a plurality of frame images of a same scene including a water surface having a wave, each frame image including a plurality of minute regions;
wherein each minute region of a frame image has a corresponding minute region in each of the other frame images respectively, wherein the corresponding minute regions of the frame images are defined as a set, and a total number of sets is equal to the number of minute regions in one frame image,
a brightness value calculation step of calculating a brightness value for each of the minute regions of each frame image respectively to obtain a plurality of brightness values, wherein a number of the plurality of frame images is greater than 2, and the minute region is a region of one pixel in each frame image;
a pixel value extraction step of, for each set of corresponding minute regions, extracting a pixel value corresponding to the minute region of a frame image in which the brightness value of the minute region is a minimum as compared to the brightness values of the minute region of other frame images in the plurality of frame images;
a storage step of storing the pixel value of each set extracted in the pixel value extraction step to obtain a plurality of pixel values; and a composite image generation step of generating a composite image corresponding to the scene based on the plurality of pixel values stored in the storage step.

7. A non-transitory computer readable recording medium storing a program causing a computer to execute an image processing process comprising:

an image obtaining step of obtaining a plurality of frame images of a same scene including a water surface having a wave, each frame image including a plurality of minute regions;

wherein each minute region of a frame image has a corresponding minute region in each of the other frame images respectively, wherein the corresponding minute regions of the frame images are defined as a set, and a total number of sets is equal to the number of minute regions in one frame image, a brightness value calculation step of calculating a brightness value for each of the minute regions of each frame image respectively to obtain a plurality of brightness values, wherein a number of the plurality of frame images is greater than 2, and the minute region is a region of one pixel in each frame image;

a pixel value extraction step of, for each set of corresponding minute regions, extracting a pixel value corresponding to the minute region of a frame image in which the brightness value of the minute region is a minimum as compared to the brightness values of the minute region of other frame images in the plurality of frame images;

a storage step of storing the pixel value of each set extracted in the pixel value extraction step to obtain a plurality of pixel values; and a composite image generation step of generating a composite image corresponding to the scene based on the plurality of pixel values stored in the storage step.

* * * * *